United States Patent
Masamoto et al.

(10) Patent No.: US 12,457,825 B2
(45) Date of Patent: Oct. 28, 2025

(54) SEMICONDUCTOR LIGHT-EMITTING ELEMENT

(71) Applicant: Nuvoton Technology Corporation Japan, Kyoto (JP)

(72) Inventors: Keimei Masamoto, Niigata (JP); Mitsuaki Oya, Tokyo (JP); Shigeo Hayashi, Kyoto (JP); Masanori Hiroki, Shiga (JP); Masahiro Kume, Toyama (JP); Gaku Nishikawa, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 839 days.

(21) Appl. No.: 17/536,472

(22) Filed: Nov. 29, 2021

(65) Prior Publication Data

US 2022/0085244 A1 Mar. 17, 2022

Related U.S. Application Data

(63) Continuation of application No. PCT/JP2020/019313, filed on May 14, 2020.

(30) Foreign Application Priority Data

Jun. 5, 2019 (JP) ................................. 2019-105735

(51) Int. Cl.
H10H 20/831 (2025.01)
H10H 20/832 (2025.01)

(52) U.S. Cl.
CPC ........ *H10H 20/831* (2025.01); *H10H 20/832* (2025.01)

(58) Field of Classification Search
CPC . H01L 33/38; H01L 2933/0016; H01L 33/40; H01L 2933/0066; H01L 33/405;
(Continued)

(56) References Cited

U.S. PATENT DOCUMENTS

2011/0215363 A1* 9/2011 Kimura ................... H01L 33/36
257/E33.062
2012/0267672 A1* 10/2012 Jeon ..................... H10H 20/831
257/E33.062
(Continued)

FOREIGN PATENT DOCUMENTS

JP 2013-048199 A 3/2013
JP 2014-022413 A 2/2014
WO 2016/163083 A1 10/2016

OTHER PUBLICATIONS

International Search Report and Written Opinion issued on Aug. 4, 2020 in International Patent Application No. PCT/JP2020/019313; with partial English translation.

*Primary Examiner* — Chad M Dicke
*Assistant Examiner* — Priya M Rampersaud
(74) *Attorney, Agent, or Firm* — Rimon P.C.

(57) ABSTRACT

A semiconductor light-emitting element includes: a semiconductor layer; an electrode disposed on the semiconductor layer, the electrode including a power feeding portion and an extension portion extending from the power feeding portion. The power feeding portion has a width greater than a width of the extension portion. The electrode includes an electrode layer and a wiring layer. The electrode layer includes a first metal layer disposed in the power feeding portion, and a second metal layer disposed closer to an extension portion side than the first metal layer is and directly connected to the first metal layer. The first metal layer and the second metal layer are in ohmic contact with the semiconductor layer. The first metal layer has an electrical conductivity higher than an electrical conductivity of the second metal layer. The wiring layer is continuously disposed on the first metal layer and the second metal layer.

17 Claims, 27 Drawing Sheets

(58) Field of Classification Search
CPC ............ H01L 33/62; H01L 24/14; H01L 2924/01322; H01L 21/0485; H01L 21/28; H01L 21/0495; H01L 21/28575; H01L 2224/04042; H01L 2224/05018; H01L 2224/05583; H01L 2224/45124; H01L 2224/45144; H01L 2224/45147; H01L 2224/16245; H01L 24/04; H01L 24/05; H01L 29/45; H01L 29/452; H01L 29/47; H01L 2924/01029; H01L 2924/12041; H01L 33/387; H01L 33/54; H10H 20/831; H10H 20/832; H10H 20/835; H10H 20/032; H10H 20/83; H10H 20/833; H10H 20/8316; H10H 20/8314; H10H 20/84; H10H 20/825; H10D 64/62
See application file for complete search history.

(56) References Cited

U.S. PATENT DOCUMENTS

| | | |
|---|---|---|
| 2014/0015019 A1 | 1/2014 | Okamoto et al. |
| 2017/0040515 A1* | 2/2017 | Lee .................. H01L 33/42 |
| 2017/0069794 A1* | 3/2017 | Kim .................. H10H 20/833 |
| 2018/0076355 A1* | 3/2018 | Hayashi ............ H10H 20/84 |
| 2018/0351031 A1* | 12/2018 | Fujimori ........... H01L 33/387 |
| 2019/0371893 A1* | 12/2019 | Iguchi .............. H01L 29/1608 |

\* cited by examiner

SEMICONDUCTOR LIGHT-EMITTING ELEMENT

CROSS REFERENCE TO RELATED APPLICATION

This is a continuation application of PCT International Application No. PCT/JP2020/019313 filed on May 14, 2020, designating the United States of America, which is based on and claims priority of Japanese Patent Application No. 2019-105735 filed on Jun. 5, 2019. The entire disclosures of the above-identified applications, including the specifications, drawings and claims are incorporated herein by reference in their entirety.

FIELD

The present disclosure relates to semiconductor light-emitting elements.

BACKGROUND

Semiconductor light-emitting elements such as light emitting diodes (LEDs) have been used as light sources of various equipment for illumination purpose or display purpose etc. In the field of large light output, for example, LEDs have been used for, among various light sources, light sources of in-vehicle illuminating devices such as daytime running lights (DRLs) and head lamps (HLs).

A semiconductor light-emitting element includes, for example, an active layer (a light-emitting layer), a semiconductor layer on the both sides of the active layer, and an electrode. The electrode includes an electrode layer in ohmic contact with the semiconductor layer, and a wiring layer stacked on the electrode layer. The electrode may be formed to include a portion having a varying width in a plan view. In this case, a portion having a varying width is formed in each of the electrode layer and wiring layer included in the electrode.

However, a current density of the electrode layer may locally increase in a portion at which a width of the electrode narrows, due to the presence of the portion having the varying width in the electrode, and resultant electromigration (EM) may deteriorate the electrode layer.

There has been conventionally proposed a technique for dividing an electrode layer at a portion in which a current density increases and providing an insulating layer to the portion at which the electrode layer is divided, in order to reduce electromigration in the portion in which the current density increases (e.g., Patent Literature (PTL) 1).

CITATION LIST

Patent Literature

PTL 1: Japanese Unexamined Patent Application Publication No. 2014-22413

SUMMARY

Technical Problem

The technique disclosed by PTL 1 can reduce electromigration but cannot prevent a driving voltage from increasing. The present disclosure has been made to solve such a problem and has an object to provide a semiconductor light-emitting element capable of reducing electromigration while suppressing an increase in driving voltage.

Solution to Problem

A semiconductor light-emitting element according to one aspect of the present disclosure includes: a semiconductor layer including a compound semiconductor; and an electrode disposed on the semiconductor layer, the electrode including a power feeding portion and an extension portion extending from the power feeding portion. The power feeding portion has a width greater than a width of the extension portion. The electrode includes an electrode layer disposed on a semiconductor layer side of the electrode, and a wiring layer disposed on the electrode layer. The electrode layer includes a first metal layer disposed in the power feeding portion, and a second metal layer disposed closer to an extension portion side than the first metal layer is and directly connected to the first metal layer. The first metal layer and the second metal layer are in ohmic contact with the semiconductor layer. The first metal layer has an electrical conductivity higher than an electrical conductivity of the second metal layer. The wiring layer is continuously disposed on the first metal layer and the second metal layer.

Advantageous Effects

According to the present disclosure, it is possible to reduce electromigration while suppressing an increase in driving voltage.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Embodiments

Hereinafter, embodiments of the present disclosure will be described with reference to the drawings. It should be noted that each of the embodiments described below shows one specific example of the present disclosure. Therefore, numerical values, shapes, materials, constituent elements, the arrangement and connection of the constituent elements, steps, order of the steps, etc. shown in the following embodiments are mere examples, and are not intended to limit the scope of the present disclosure.

Moreover, the respective figures are schematic diagrams and are not necessarily precise illustrations. Therefore, the scales etc. in the respective figures are not necessarily uniform. It should be noted that, in the respective figures, the same reference sign is assigned to substantially identical constituent elements, and overlapping description is omitted or simplified.

Embodiment 1

[Semiconductor Light-Emitting Element]

Figure 1:
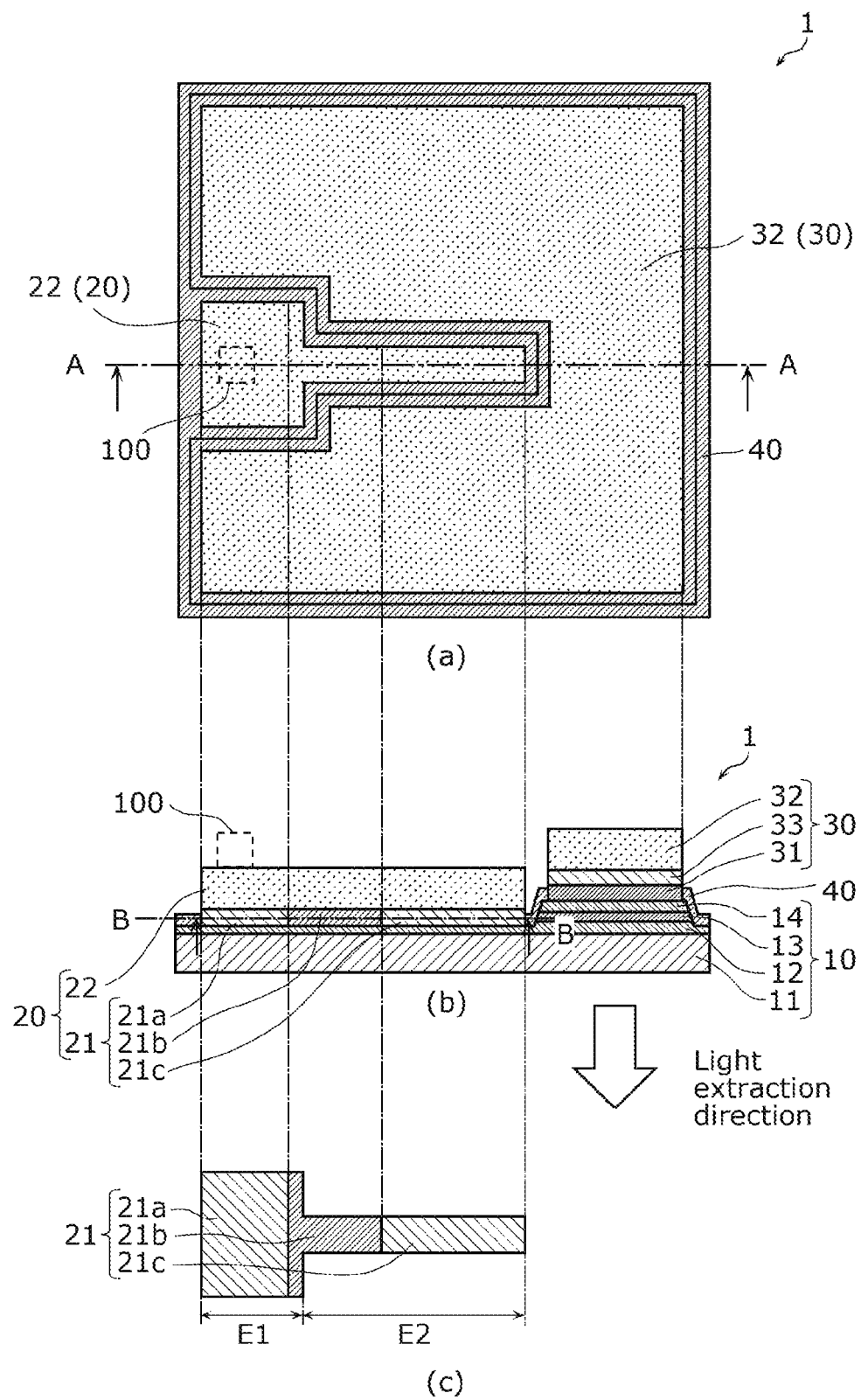
FIG. 1 is a diagram illustrating a configuration of a semiconductor light-emitting element according to Embodiment 1.

First, a configuration of semiconductor light-emitting element 1 according to Embodiment 1 will be described with reference to FIG. 1. In FIG. 1, (a) is a plan view of semiconductor light-emitting element 1 according to Embodiment 1, (b) is a vertical cross-sectional view of semiconductor light-emitting element 1 along line A-A shown by (a), and (c) is a horizontal cross-sectional view of semiconductor light-emitting element 1 along line B-B shown by (b). It should be noted that in order to facilitate understanding of a positional relationship between respective components, hatching is also used for the plan view of (a) for descriptive purposes in FIG. 1. The same applies to the subsequent figures.

As shown by FIG. 1, semiconductor light-emitting element 1 according to Embodiment 1 includes semiconductor stacked structure 10, and n-side electrode 20 and p-side electrode 30 disposed on semiconductor stacked structure 10. In the present embodiment, semiconductor light-emitting element 1 is a light-emitting diode (LED) chip having a single side electrode structure in which both n-side electrode 20 and p-side electrode 30 are disposed on one side.

Semiconductor stacked structure 10 includes substrate 11, n-type semiconductor layer 12 (a first conductivity type semiconductor layer), active layer 13 to be a light-emitting layer, and p-type semiconductor layer 14 (a second conductivity type semiconductor layer). n-type semiconductor layer 12, active layer 13, and p-type semiconductor layer 14 constitute a semiconductor stacked body disposed on substrate 11. Specifically, n-type semiconductor layer 12, active layer 13, and p-type semiconductor layer 14 are stacked on substrate 11 in stated order.

n-type semiconductor layer 12, active layer 13, and p-type semiconductor layer 14 include a compound semiconductor. In the present embodiment, n-type semiconductor layer 12, active layer 13, and p-type semiconductor layer 14 include a III-V compound semiconductor such as GaN.

n-side electrode 20 is a first electrode and disposed on n-type semiconductor layer 12. Specifically, n-side electrode 20 is disposed in an exposure region in which n-type semiconductor layer 12 is partially exposed by removing part of p-type semiconductor layer 14 and active layer 13. On the other hand, p-side electrode 30 is a second electrode and disposed on p-type semiconductor layer 14.

In the present embodiment, insulating film 40 is disposed on semiconductor stacked structure 10. In addition, n-side electrode 20 is disposed on n-type semiconductor layer 12 exposed from an opening of insulating film 40, and p-side electrode 30 is disposed on p-type semiconductor layer 14 exposed from the opening of insulating film 40. It should be noted that insulating film 40 is, for example, an oxide film including $SiO_2$ etc.

n-side electrode 20 includes n-side electrode layer 21 disposed on an n-type semiconductor layer 12 side, and n-side wiring layer 22 disposed on n-side electrode layer 21. Specifically, n-side electrode layer 21 is stacked on n-type semiconductor layer 12, and n-side wiring layer 22 is stacked on n-side electrode layer 21. It should be noted that n-type semiconductor layer 12 and n-side electrode layer 21 are in contact with each other, and n-side electrode layer 21 and n-side wiring layer 22 are in contact with each other. In the present embodiment, n-side electrode layer 21 and n-side wiring layer 22 have the same shape in a plan view.

n-side electrode 20 includes power feeding portion E1 and extension portion E2 extending from power feeding portion E1. Power feeding portion E1 is connected to power feeding terminal 100 in n-side electrode 20. To put it another way, power feeding portion E1 is supplied with electrons. Power feeding terminal 100 is, for example, a bump or a wire. Extension portion E2 distributes the electrons supplied to power feeding portion E1 to n-type semiconductor layer 12. In the present embodiment, power feeding portion E1 has a width greater than a width of extension portion E2 in a direction orthogonal to the extension direction of extension portion E2. In other words, the width of extension portion E2 is less than the width of power feeding portion E1. Accordingly, n-side electrode 20 includes a portion having a varying width. Stated differently, each of n-side electrode layer 21 and n-side wiring layer 22 includes a portion having a varying width.

n-side electrode layer 21 includes first metal layer 21a disposed in power feeding portion E1, and second metal layer 21b disposed closer to an extension portion E2 side than first metal layer 21a is. In the present embodiment, second metal layer 21b is directly connected to first metal layer 21a. First metal layer 21a and second metal layer 21b comprise a metal material.

n-side electrode layer 21 further includes third metal layer 21c in extension portion E2. Third metal layer 21c comprises a metal material. Third metal layer 21c is located across second metal layer 21b from a first metal layer 21a side. Accordingly, second metal layer 21b is located between first metal layer 21a and third metal layer 21c in the extension direction of extension portion E2. To put it another way, n-side electrode layer 21 is divided into first metal layer 21a and third metal layer 21c in the extension direction of extension portion E2, and second metal layer 21b is disposed in the divided portion. In the present embodiment, third metal layer 21c is directly connected to second metal layer 21b.

Second metal layer 21b is disposed close to a position at which the width of n-side electrode layer 21 varies relative to at least the extension direction of extension portion E2. In the present embodiment, second metal layer 21b is over the position at which the width of n-side electrode layer 21 varies. In other words, second metal layer 21b is disposed both in power feeding portion E1 and extension portion E2.

Each of first metal layer 21a, second metal layer 21b, and third metal layer 21c is in contact with n-type semiconductor layer 12. Specifically, first metal layer 21a, second metal layer 21b, and third metal layer 21c are in ohmic contact with n-type semiconductor layer 12.

First metal layer 21a has an electrical conductivity higher than an electrical conductivity of second metal layer 21b. Moreover, third metal layer 21c has an electrical conductivity higher than the electrical conductivity of second metal layer 21b. Furthermore, in order to reflect light generated by active layer 13, first metal layer 21a, second metal layer 21b, and third metal layer 21c may comprise a metal material having light reflectivity. In the present embodiment, first metal layer 21a and third metal layer 21c comprise the same material.

First metal layer 21a and third metal layer 21c can be formed of, for example, aluminum (Al) or an alloy including aluminum. In the present embodiment, first metal layer 21a and third metal layer 21c comprise aluminum.

Second metal layer 21b having the electrical conductivity lower than the electrical conductivity of each of first metal layer 21a and third metal layer 21c can be formed of at least one type of a metal material selected from, for example, titanium (Ti), tungsten (W), and chrome (Cr), or an alloy including at least one type of a metal material selected from those. In the present embodiment, second metal layer 21b comprises titanium.

n-side wiring layer 22 stacked on n-side electrode layer 21 is continuously disposed on first metal layer 21a, second metal layer 21b, and third metal layer 21c of n-side electrode layer 21. To put it another way, n-side wiring layer 22 continuously extends across power feeding portion E1 and extension portion E2.

Power feeding terminal 100 is connected to a portion of n-side wiring layer 22 corresponding to power feeding portion E1. Supply of electrons from power feeding portion E1 of n-side wiring layer 22 causes current to flow from power feeding portion E1 to extension portion E2 of n-side electrode 20, which distributes the current to the entire region of power feeding portion E1 and extension portion E2 of n-side electrode 20.

n-side wiring layer 22 comprises a metal material. n-side wiring layer 22 may have a wiring resistance value lower than a wiring resistance value of n-side electrode layer 21. In other words, n-side wiring layer 22 may comprise a metal material having a wiring resistance value lower than an average wiring resistance value of n-side electrode layer 21 including first metal layer 21a, second metal layer 21b, and third metal layer 21c. In particular, in extension portion E2, the wiring resistance value of n-side wiring layer 22 may be lower than the wiring resistance value (the average wiring resistance value) of n-side electrode layer 21. n-side wiring layer 22 can be formed of at least one type of a metal material selected from, for example, copper (Cu), silver (Ag), and gold (Au), or an alloy including at least one type of a metal material selected from those.

p-side electrode 30 includes p-side electrode layer 31 disposed on a p-type semiconductor layer 14 side, and p-side wiring layer 32 disposed on p-side electrode layer 31. In the present embodiment, p-side electrode 30 includes p-side diffusion barrier layer 33 in order to suppress mutual diffusion of a metal material included in p-side electrode layer 31 and a metal material included in p-side wiring layer 32. p-side diffusion barrier layer 33 is disposed between p-side electrode layer 31 and p-side wiring layer 32.

p-side electrode layer 31 is stacked on p-type semiconductor layer 14, p-side diffusion barrier layer 33 is stacked on p-side electrode layer 31, and p-side wiring layer 32 is stacked on p-side diffusion barrier layer 33. It should be noted that p-side electrode layer 31, p-side diffusion barrier layer 33, and p-side wiring layer 32 have the same shape in a plan view.

p-side electrode layer 31 is in contact with p-type semiconductor layer 14. Specifically, p-side electrode layer 31 is in ohmic contact with p-type semiconductor layer 14.

In the present embodiment, p-side electrode layer 31 and p-side wiring layer 32 comprise a metal material. In order to reflect light generated by active layer 13, p-side electrode layer 31 may comprise a metal material having light reflectivity.

p-side electrode layer 31 can be formed of at least one type of a metal material selected from, for example, aluminum (Al), silver (Ag), and rhodium (Rh), or an alloy including at least one type of a metal material selected from those. In the present embodiment, p-side electrode layer 31 comprises silver.

Moreover, p-side wiring layer 32 comprises, for example, gold (Au), and p-side diffusion barrier layer 33 comprises, for example, titanium (Ti).

In semiconductor light-emitting element 1 thus configured, application of a predetermined driving voltage to n-side electrode 20 and p-side electrode 30 causes active layer 13 to generate light. The light generated by active layer 13 is extracted not from a p-side electrode 30 side but from a substrate 11 side. To put it another way, a light extraction direction of semiconductor light-emitting element 1 is the downward direction shown by FIG. 1.

[Method of Manufacturing Semiconductor Light-Emitting Element]

Next, a method of manufacturing semiconductor light-emitting element 1 according to Embodiment 1 will be described with reference to FIG. 2A to FIG. 2H. FIG. 2A to FIG. 2H are for describing the method of manufacturing semiconductor light-emitting element 1 according to Embodiment 1.

Figure 2A:
FIG. 2A is a diagram illustrating a step of preparing a substrate in a method of manufacturing a semiconductor light-emitting element according to Embodiment 1.

First, as shown by FIG. 2A, substrate 11 is prepared. In the present embodiment, a wafer including GaN (a GaN substrate) is used as a transmissive substrate including a semiconductor, for substrate 11.

Figure 2B:
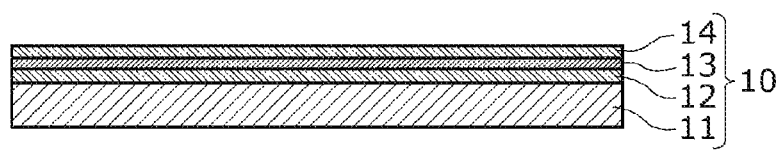
FIG. 2B is a diagram illustrating a step of forming a semiconductor stacked structure in the method of manufacturing the semiconductor light-emitting element according to Embodiment 1.

Next, as shown by FIG. 2B, n-type semiconductor layer 12, active layer 13, and p-type semiconductor layer 14 are sequentially stacked on substrate 11 by metal-organic vapor phase epitaxy (MOVPE), to form semiconductor stacked structure 10.

In the present embodiment, n-type semiconductor layer 12 is an n-type nitride semiconductor layer (e.g., a GaN layer), active layer 13 is a nitride semiconductor light-emitting layer, and p-type semiconductor layer 14 is a p-type nitride semiconductor layer. The nitride semiconductor light-emitting layer included in active layer 13 comprises at least Ga and N, and can be made to include a proper amount of In according to the needs, to obtain a desired emission wavelength. In the present embodiment, active layer 13 is an InGaN layer, and an In composition ratio of the InGaN layer is set so that the InGaN layer has an emission peak wavelength of 450 nm.

Figure 2C:
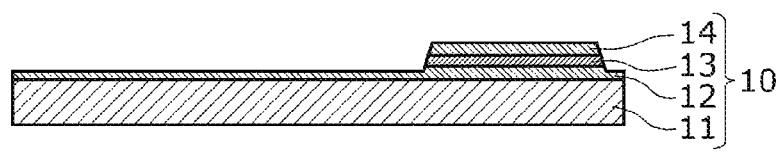
FIG. 2C is a diagram illustrating a step of etching the semiconductor stacked structure in the method of manufacturing the semiconductor light-emitting element according to Embodiment 1.

Then, as shown by FIG. 2C, part of p-type semiconductor layer 14, active layer 13, and n-type semiconductor layer 12 of semiconductor stacked structure 10 is removed by dry etching, to expose part of n-type semiconductor layer 12 from p-type semiconductor layer 14 and active layer 13. Accordingly, an exposure region can be formed in the part of n-type semiconductor layer 12.

Figure 2D:
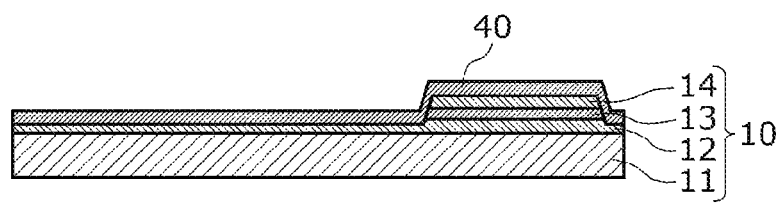
FIG. 2D is a diagram illustrating a step of forming an insulating film in the method of manufacturing the semiconductor light-emitting element according to Embodiment 1.

After that, as shown by FIG. 2D, insulating film 40 is formed on the entire top surface of semiconductor stacked structure 10 including the exposure region of n-type semiconductor layer 12. In the present embodiment, an oxide film comprising $SiO_2$ is formed as insulating film 40.

Subsequently, although not shown, a resist is applied to insulating film 40, an opening is formed in the resist at a position corresponding to p-type semiconductor layer 14 by photolithography, and insulating film 40 inside the opening of the resist is removed by etching using hydrofluoric acid. As a result, p-type semiconductor layer 14 is exposed.

Figure 2E:
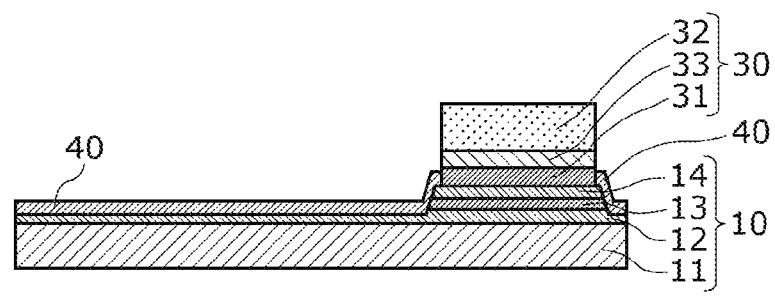
FIG. 2E is a diagram illustrating a step of forming a p-side electrode in the method of manufacturing the semiconductor light-emitting element according to Embodiment 1.

Next, as shown by FIG. 2E, p-side electrode 30 is formed in the exposure region of p-type semiconductor layer 14. Specifically, metal films, which are to be p-side electrode layer 31, p-side diffusion barrier layer 33, and p-side wiring layer 32, are sequentially formed by electron beam (EB) deposition to form a metal stacked film, and the resist and a redundant portion of the metal stacked film are removed by resist lift off. In consequence, p-side electrode 30 is formed in the exposure region of p-type semiconductor layer 14 from which insulating film 40 has been removed. Accordingly, it is possible to form p-side electrode 30 having the stacked structure of p-side electrode layer 31, p-side diffusion barrier layer 33, and p-side wiring layer 32.

In the present embodiment, an Ag layer (a film thickness of 0.2 μm), which is to be p-side electrode layer 31, a Ti layer (a film thickness of 0.7 μm), which is to be p-side diffusion barrier layer 33, and an Au layer (a film thickness of 1.0 μm), which is to be p-side wiring layer 32, are sequentially formed in a direction away from a side close to p-type semiconductor layer 14. It should be noted that the method of forming metal films, which are to be p-side electrode layer 31, p-side diffusion barrier layer 33, and p-side wiring layer 32, is not limited to EB deposition, and may be sputtering.

Moreover, p-side electrode 30 may be formed away from insulating film 40. In other words, p-side electrode layer 31 and insulating film 40 may be separated from each other. In this case, p-type semiconductor layer 14 is exposed between p-side electrode 30 and insulating film 40.

Subsequently, although not shown, a resist is applied to cover the whole, an opening is formed in the resist at a position corresponding to n-type semiconductor layer 12 by photolithography, and insulating film 40 inside the opening of the resist is removed by etching using hydrofluoric acid. As a result, n-type semiconductor layer 12 is exposed.

Figure 2F:
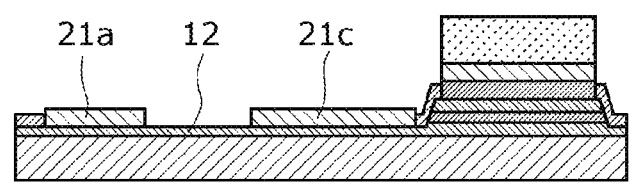
FIG. 2F is a diagram illustrating a step of forming a first metal layer and a third metal layer in an n-side electrode layer of an n-side electrode in the method of manufacturing the semiconductor light-emitting element according to Embodiment 1.

Then, as shown by FIG. 2F, first metal layer 21a and third metal layer 21c are formed in part of the exposure region of n-type semiconductor layer 12. Specifically, a first metal film, which is to be first metal layer 21a and third metal layer 21c, is formed by EB deposition, and the resist and a redundant portion of the first metal film are removed by resist lift off. First metal layer 21a and third metal layer 21c that are separated from each other are formed in the exposure region of n-type semiconductor layer 12 from which insulating film 40 has been removed. Accordingly, first metal layer 21a and third metal layer 21c comprising the same material are formed in contact with n-type semiconductor layer 12. It should be noted that first metal layer 21a and third metal layer 21c are not formed in the portion removed from the first metal film, and n-type semiconductor layer 12 is exposed again.

Since first metal layer 21a and third metal layer 21c directly stacked on n-type semiconductor layer 12 each serve not only as an ohmic contact layer for n-type semiconductor layer 12 but also as a reflective layer that reflects light, first metal layer 21a and third metal layer 21c may comprise a metal material including Al etc. In the present embodiment, Al layers (a film thickness of 0.3 μm) are formed as first metal layer 21a and third metal layer 21c. It should be noted that the method of forming the first metal film, which is to be first metal layer 21a and third metal layer 21c, is not limited to EB deposition, and may be sputtering.

Moreover, first metal layer 21a and third metal layer 21c may be formed away from insulating film 40. To put it another way, each of first metal layer 21a and third metal layer 21c may be separated from insulating film 40. In this case, n-type semiconductor layer 12 is exposed between each of first metal layer 21a and third metal layer 21c and insulating film 40.

Figure 2G:
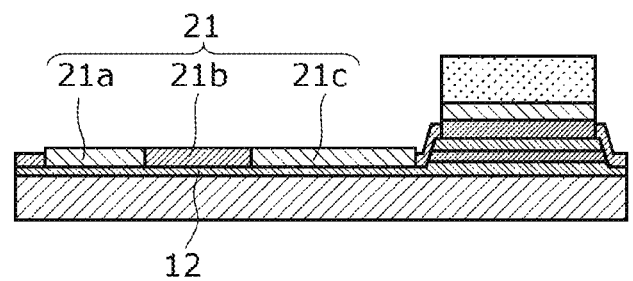
FIG. 2G is a diagram illustrating a step of forming a second metal layer in the n-side electrode layer of the n-side electrode in the method of manufacturing the semiconductor light-emitting element according to Embodiment 1.

After that, as shown by FIG. 2G, second metal layer 21b is formed in the exposure region of n-type semiconductor layer 12 between first metal layer 21a and third metal layer 21c. Specifically, a resist is applied to cover the whole, an opening is formed in the resist at a position corresponding to second metal layer 21b by photolithography, a second metal film, which is to be second metal layer 21b, is formed by EB deposition, and the resist and a redundant portion of the second metal film are removed by resist lift off. As a result, second metal layer 21b is formed in the exposure region in which n-type semiconductor layer 12 is exposed. Accordingly, second metal layer 21b is formed embedded between first metal layer 21a and third metal layer 21c and in contact with n-type semiconductor layer 12.

Second metal layer 21b directly stacked on n-type semiconductor layer 12 serves not only as an ohmic contact layer for n-type semiconductor layer 12 but also as a reflective layer that reflects light. Moreover, second metal layer 21b may comprise a metal material having an electromigration resistance higher than an electromigration resistance of first metal layer 21a and third metal layer 21c, and an electrical conductivity lower than an electrical conductivity of first metal layer 21a and third metal layer 21c. For this reason, Ti, W, Cr, etc. can be used as a metal material included in second metal layer 21b. In the present embodiment, a Ti layer (a film thickness of 0.3 μm) is formed as second metal layer 21b. It should be noted that the method of forming the second metal film, which is to be second metal layer 21b, is not limited to EB deposition, and may be sputtering.

As stated above, by forming second metal layer 21b between first metal layer 21a and third metal layer 21c, it is possible to form n-side electrode layer 21 including first metal layer 21a, second metal layer 21b, and third metal layer 21c.

Figure 2H:
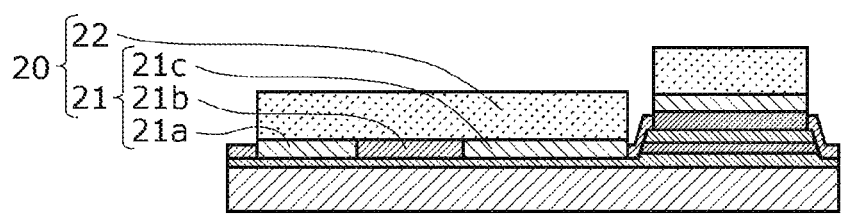
FIG. 2H is a diagram illustrating a step of forming an n-side wiring layer of the n-side electrode in the method of manufacturing the semiconductor light-emitting element according to Embodiment 1.

Finally, as shown by FIG. 2H, n-side wiring layer 22 is formed on n-side electrode layer 21. Specifically, a resist is applied to cover the whole, an opening is formed in the resist at a position corresponding to n-side electrode layer 21 by photolithography, a third metal film, which is to be n-side wiring layer 22, is formed by EB deposition, and the resist and a redundant portion of the third metal film are removed by resist lift off. In consequence, n-side wiring layer is formed on n-side electrode layer 21. In other words, n-side wiring layer 22 is formed on first metal layer 21a, second metal layer 21b, and third metal layer 21c to extend across first metal layer 21a, second metal layer 21b, and third metal layer 21c.

n-side wiring layer 22 stacked on n-side electrode layer 21 may comprise a metal material having an electromigration resistance higher than an electromigration resistance of n-side electrode layer 21, and an average wiring resistance value lower than an average wiring resistance value of n-side electrode layer 21. For this reason, Au, Cu, Ag, etc. may be used as a metal material included in n-side wiring layer 22. In the present embodiment, an Au layer (a film thickness of 1.0 μm) is formed as n-side wiring layer 22. It should be noted that the method of forming the third metal film, which is to be n-side wiring layer 22, is not limited to EB deposition, and may be sputtering.

As stated above, by forming n-side wiring layer 22 on n-side electrode layer 21, it is possible to form n-side electrode 20 having the stack structure of n-side electrode layer 21 and n-side wiring layer 22.

In this manner, it is possible to manufacture semiconductor light-emitting element 1 according to the present embodiment shown by FIG. 1.

[Effects etc.]

Next, the effects of semiconductor light-emitting element 1 according to the present embodiment will be described with reference to FIG. 3 to FIG. 5.

Figure 3:
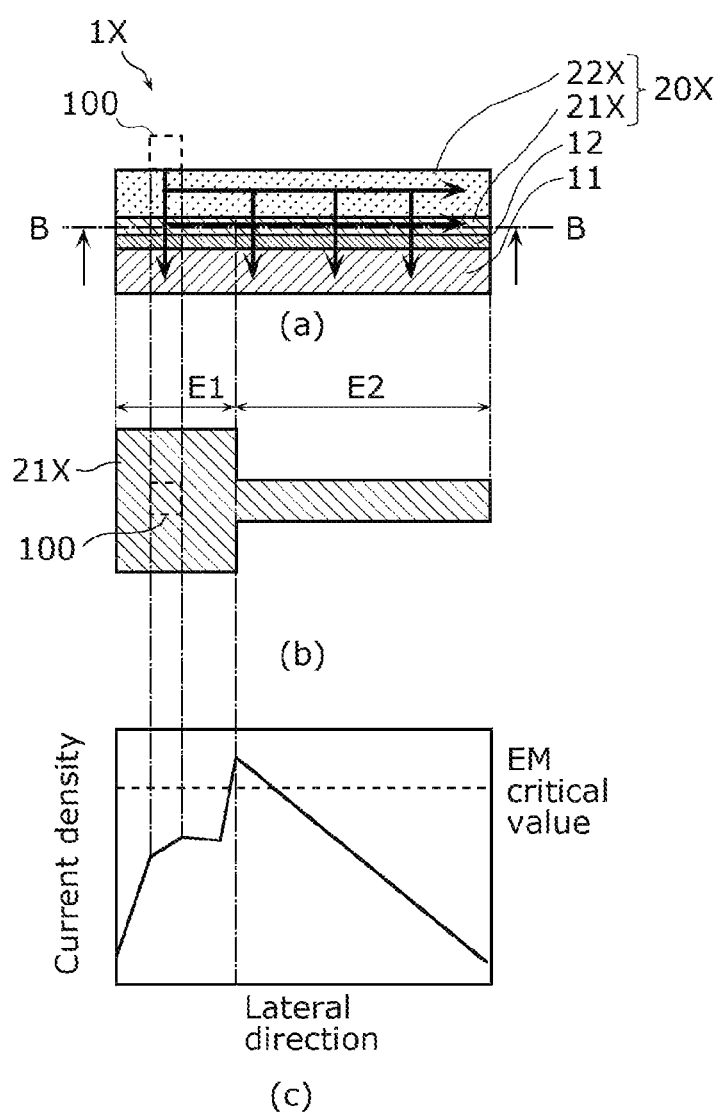
FIG. 3 is a diagram illustrating a configuration of an n-side electrode of a semiconductor light-emitting element according to Comparative Example 1, and a current density of an n-side electrode layer of the n-side electrode in the lateral direction (an extension direction of an extension portion).

(a) in FIG. 3 is a vertical cross-sectional view of a configuration of n-side electrode 20X of semiconductor light-emitting element 1X according to Comparative Example 1. (b) in FIG. 3 is a horizontal cross-sectional view of n-side electrode layer 21X of n-side electrode 20X along B-B line shown by (a) in FIG. 3. (c) in FIG. 3 is a diagram illustrating a current density of n-side electrode layer 21X of n-side electrode 20X in the lateral direction (the extension direction of the extension portion).

Figure 4:
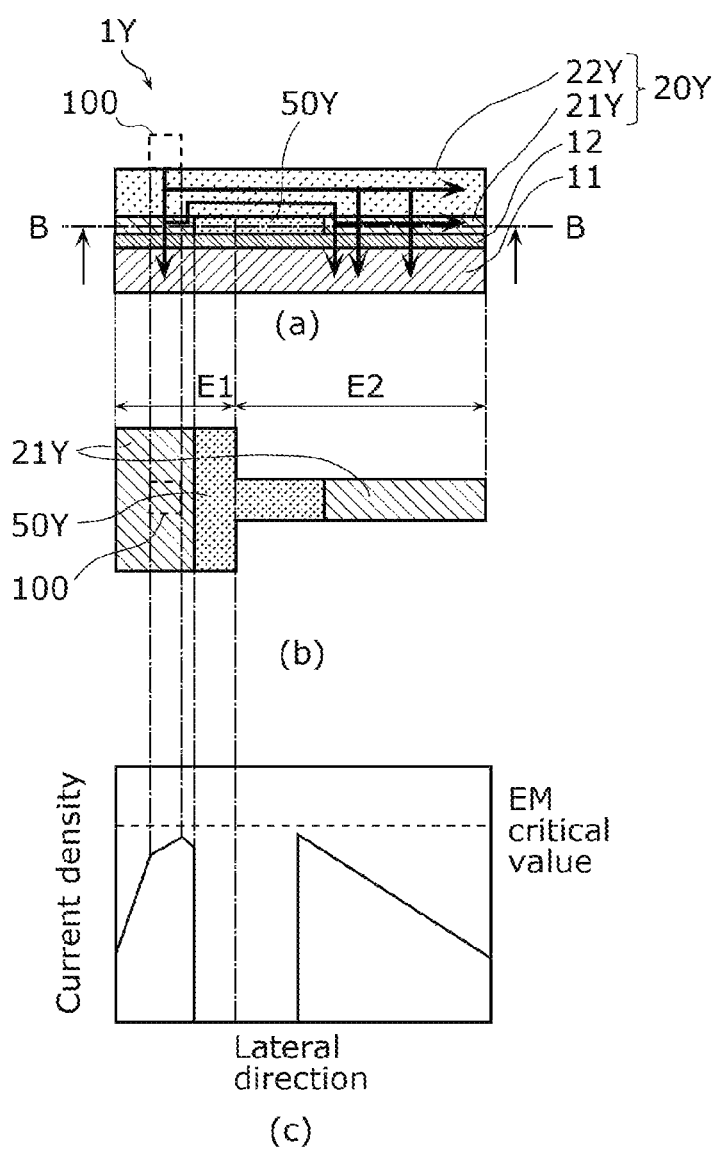
FIG. 4 is a diagram illustrating a configuration of an n-side electrode of a semiconductor light-emitting element according to Comparative Example 2, and a current density of an n-side electrode layer of the n-side electrode in the lateral direction (an extension direction of an extension portion).

(a) in FIG. 4 is a vertical cross-sectional view of a configuration of n-side electrode 20Y of semiconductor light-emitting element 1Y according to Comparative Example 2. (b) in FIG. 4 is a horizontal cross-sectional view of n-side electrode layer 21Y of n-side electrode 20Y along B-B line shown by (a) in FIG. 4. (c) in FIG. 4 is a diagram illustrating a current density of n-side electrode layer 21Y of n-side electrode 20Y in the lateral direction (the extension direction of the extension portion).

Figure 5:
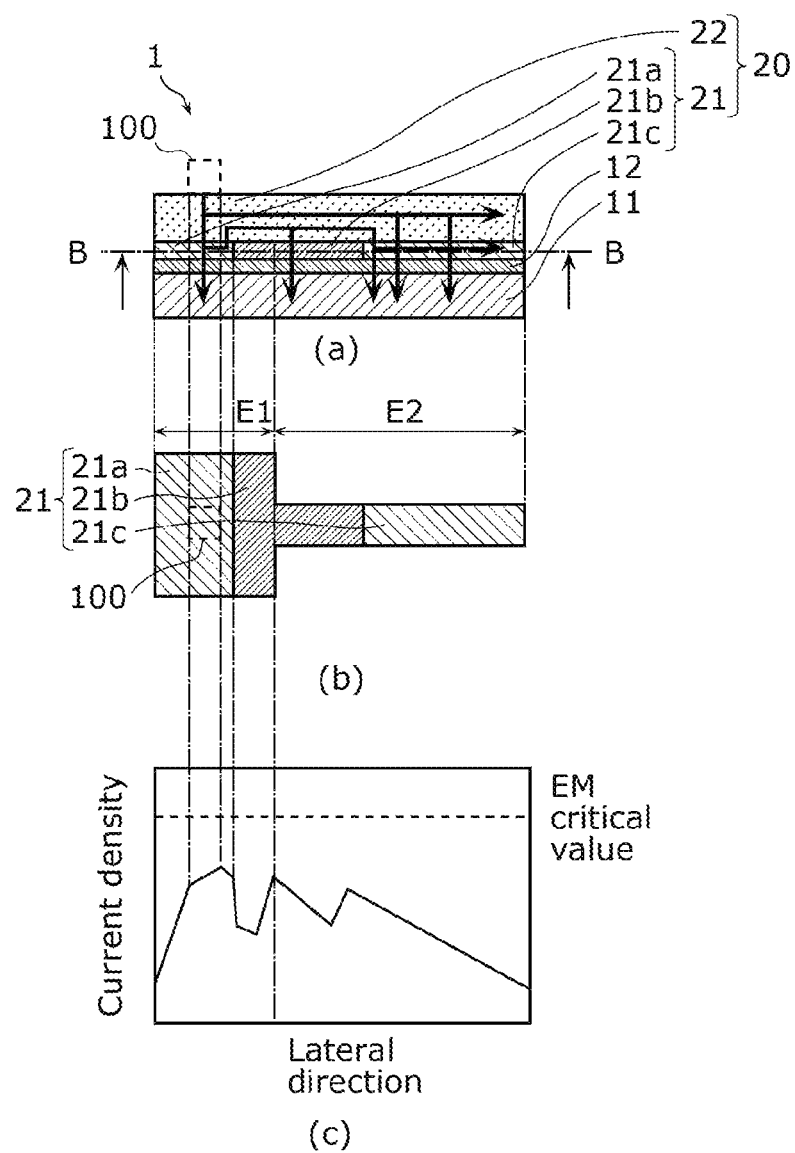
FIG. 5 is a diagram illustrating a configuration of the n-side electrode of the semiconductor light-emitting element according to Embodiment 1, and a current density of the n-side electrode layer of the n-side electrode in the lateral direction (an extension direction of an extension portion).

(a) in FIG. 5 is a vertical cross-sectional view of a configuration of n-side electrode 20 of semiconductor light-emitting element 1 according to Embodiment 1. (b) in FIG. 5 is a horizontal cross-sectional view of n-side electrode layer 21 of n-side electrode 20 along B-B line shown by (a) in FIG. 5. (c) in FIG. 5 is a diagram illustrating a current density of n-side electrode layer 21 of n-side electrode 20 in the lateral direction (the extension direction of the extension portion).

It should be noted that the arrows shown by (a) in FIG. 3, (a) in FIG. 4, and (a) in FIG. 5 represent flows of electrons.

As shown by (a) and (b) in FIG. 3, n-side electrode 20X in semiconductor light-emitting element 1X according to Comparative Example 1 includes n-side electrode layer 21X disposed on n-type semiconductor layer 12 on substrate 11, and n-side wiring layer 22X disposed on n-side electrode layer 21X.

In a plan view, n-side electrode 20X includes a portion having a varying width. Specifically, n-side electrode 20X includes power feeding portion E1 and extension portion E2 that extends from power feeding portion E1 and has a width less than a width of power feeding portion E1. Stated differently, n-side electrode layer 20X (n-side electrode layer 21X and n-side wiring layer 22X) includes the portion having the varying width.

In semiconductor light-emitting element 1X thus configured according to Comparative Example 1, as shown by (c) in FIG. 3, a current density of n-side electrode layer 21X may locally increase in the portion of n-side electrode 20X having the varying width, to exceed a critical value of electromigration (EM). As a result, the electromigration may occur in the portion of n-side electrode 20X having the varying width, and n-side electrode layer 21X may be degraded.

In view of this, a structure of semiconductor light-emitting element 1Y according to Comparative Example 2 has been examined to reduce the electromigration in the portion of n-side electrode 20X having the varying width.

As shown by (a) and (b) in FIG. 4, as with semiconductor light-emitting element 1X according to Comparative Example 1, n-side electrode 20Y in semiconductor light-emitting element 1Y according to Comparative Example 2 includes n-side electrode layer 21Y disposed on n-type semiconductor layer 12 on substrate 11, and n-side wiring layer 22Y disposed on n-side electrode layer 21Y.

Moreover, as with semiconductor light-emitting element 1X according to Comparative Example 1, in semiconductor light-emitting element 1Y according to Comparative Example 2, n-side electrode 20Y has a varying width. Specifically, n-side electrode 20Y includes power feeding portion E1 and extension portion E2 that extends from power feeding portion E1 and has a width less than a width of power feeding portion E1. Stated differently, n-side electrode layer 20Y (n-side electrode layer 21Y and n-side wiring layer 22Y) includes the portion having the varying width.

On the other hand, unlike semiconductor light-emitting element 1X according to Comparative Example 1, in semiconductor light-emitting element 1Y according to Comparative Example 2, n-side electrode layer 21Y is divided in the portion of n-side electrode 20Y having the varying width, and insulating layer 50Y is disposed in the portion in which n-side electrode layer 21Y is divided. To put it another way, n-side electrode 20Y includes two divided n-side electrode layers 21Y and insulating layer 50Y embedded between two n-side electrode layers 21Y.

As shown by (c) in FIG. 4, n-side electrode 20Y of semiconductor light-emitting element 1Y thus configured according to Comparative Example 2 makes it possible to reduce a current density of n-side electrode layer 21Y to zero, in the portion in which insulating layer 50Y is disposed. Accordingly, it is possible to reduce the occurrence of electromigration in the portion of n-side electrode 20Y having the varying width.

However, in semiconductor light-emitting element 1Y according to Comparative Example 2 shown by FIG. 4, as shown by (a) in FIG. 4, an ohmic contact area between n-side electrode 20Y and n-type semiconductor layer 12 decreases, and a drive voltage increases.

In contrast, in semiconductor light-emitting element 1 according to the present embodiment, as shown by (a) and (b) in FIG. 5, n-side electrode 20 includes n-side electrode layer 21 and n-side wiring layer 22 disposed on n-side electrode layer 21, and n-side electrode layer 21 includes first metal layer 21a disposed in power feeding portion E1, and second metal layer 21b disposed closer to an extension portion E2 side than first metal layer 21a is and having an electrical conductivity lower than an electrical conductivity of first metal layer 21a.

As shown by (a) in FIG. 5, n-side electrode 20 thus configured makes it possible to bypass to n-side wiring layer 22 part of the current laterally flowing through n-side electrode layer 21, in the portion in which second metal layer 21b is disposed. As shown by (c) in FIG. 5, this makes it possible to reduce a lateral current density of n-side electrode layer 21, in the portion in which second metal layer 21b is disposed. Accordingly, it is possible to remove a portion in which a current density exceeds a critical value of electromigration, in the portion of n-side electrode 20 having the varying width. In addition, using not an insulating layer but second metal layer 21b that is electrically conductive reduces the occurrence of a portion in which a current density is reduced to zero, in n-side electrode layer 21. For this reason, semiconductor light-emitting element 1 according to the present embodiment can increase an ohmic contact area between n-side electrode 20 and n-type semiconductor layer 12, compared to semiconductor light-emitting element 1Y according to Comparative Example 2 shown by FIG. 4. In consequence, it is possible to suppress an increase in driving voltage.

As described above, even when a portion having a varying width is disposed in n-side electrode 20, semiconductor light-emitting element 1 according to the present embodiment is capable of reducing electromigration while suppressing an increase in driving voltage.

Moreover, in semiconductor light-emitting element 1 according to the present embodiment, first metal layer 21a and third metal layer 21c comprise aluminum having a high optical reflectance, and only a portion of second metal layer 21b having a high current density comprises titanium having a lower optical reflectance than aluminum does. Since this configuration can reduce a decrease in average reflectance of n-side electrode layer 22, it is possible to reduce a decrease in light extraction efficiency.

Furthermore, in semiconductor light-emitting element 1 according to the present embodiment, n-side wiring layer 22 has a wiring resistance value lower than a wiring resistance value (an average wiring resistance value) of n-side electrode layer 21 in extension portion E2 of n-side electrode 20.

When n-side electrode layer 21 and n-side wiring layer 22 are assumed as a parallel circuit, this configuration helps the electrons supplied to n-side electrode 20 from power feeding portion E1 toward extension portion E2 flow more to n-side wiring layer 22 than to n-side electrode layer 21. In other words, it is possible to increase the amount of current bypass to n-side wiring layer 22. Accordingly, it is possible to more effectively reduce electromigration.

Figure 6:
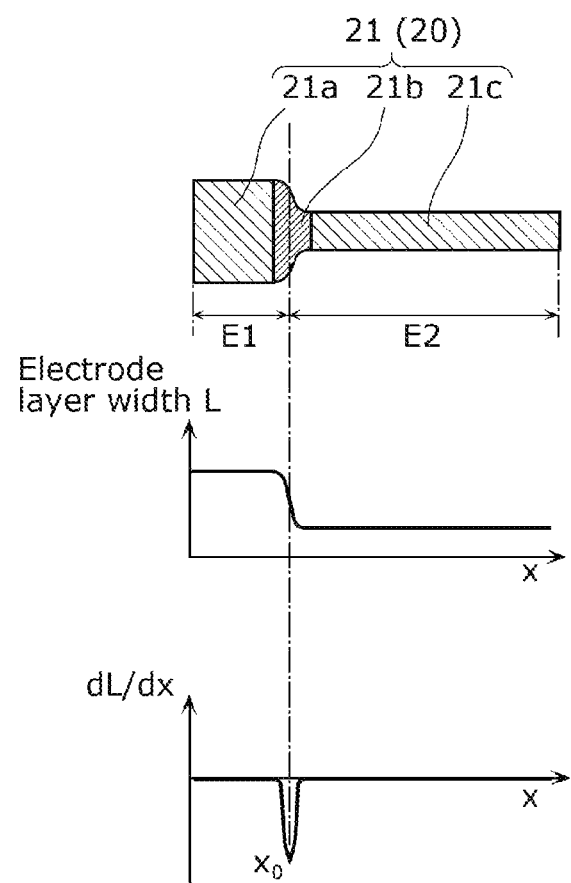
FIG. 6 is a diagram illustrating a variation of the n-side electrode layer in the n-side electrode of the semiconductor light-emitting element according to Embodiment 1.

It should be noted that as in semiconductor light-emitting element 1 according to the present embodiment, when the width of n-side electrode 20 varies rapidly, a position at which the width of n-side electrode 20 varies is clear. As shown by FIG. 6, however, when the width of n-side electrode 20 varies smoothly, a position at which the width of n-side electrode 20 varies is position x which is along a direction from power feeding portion E1 to extension portion E2 and at which a differential value (dL/dx) of width L of n-side electrode layer 21 is minimum.

On the other hand, as shown by (b) in FIG. 5, when the width of n-side electrode 20 varies rapidly, a differential value (dL/dx) of width L of n-side electrode layer 21 at position x along a direction from power feeding portion E1 to extension portion E2 is discontinuous.

Accordingly, second metal layer 21b of n-side electrode layer 21 in n-side electrode 20 may be disposed in a region including position x which is along the direction from power feeding portion E1 to extension portion E2 and at which the differential value of width L of n-side electrode layer 21 is minimum, or a region including a position at which the differential value is discontinuous.

Figure 7:
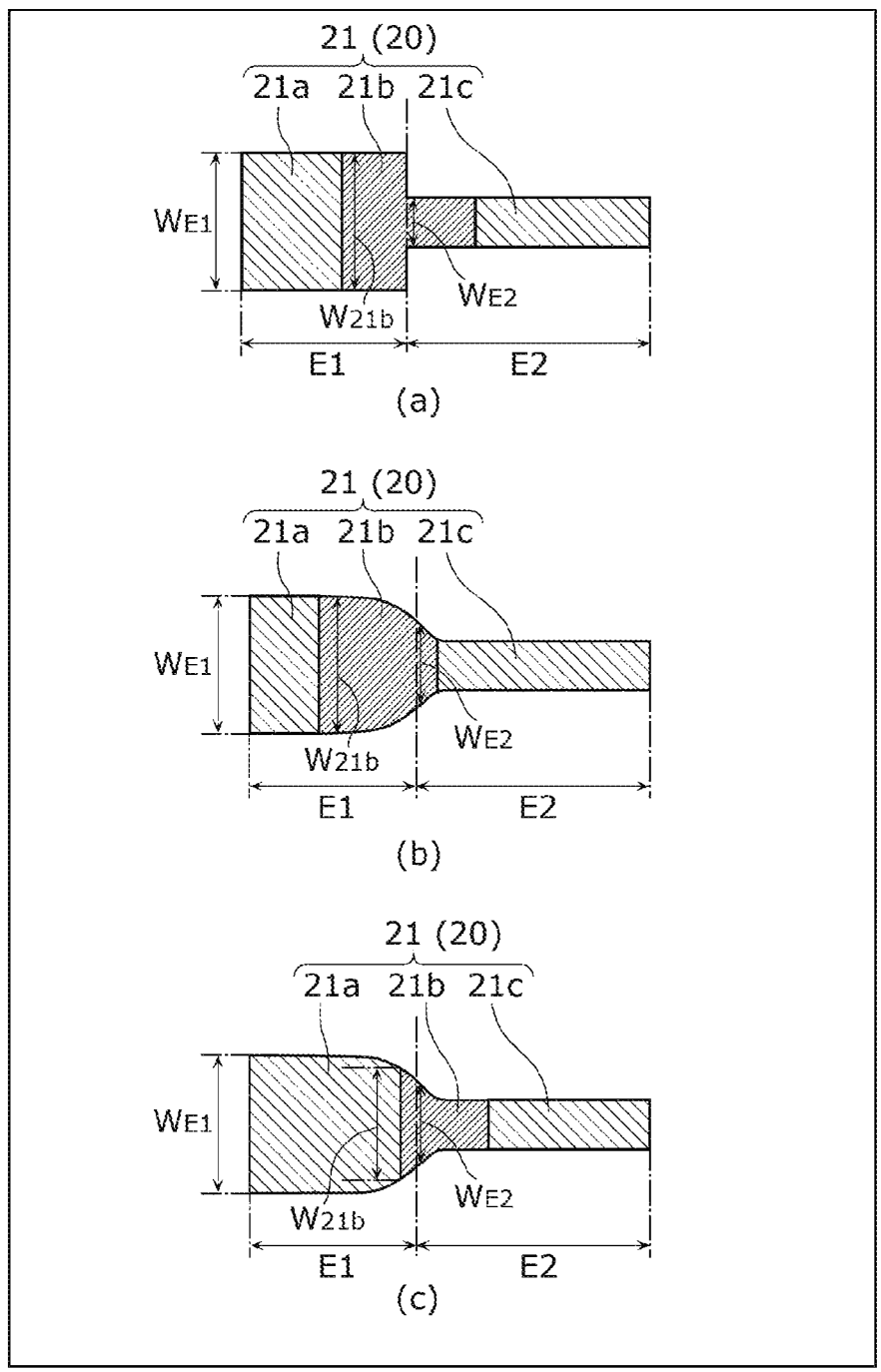
FIG. 7 is a diagram illustrating another variation of the n-side electrode layer in the n-side electrode of the semiconductor light-emitting element according to Embodiment 1.

Moreover, as shown by (a) to (c) in FIG. 7, when at least part of second metal layer 21b of n-side electrode layer 21 in n-side electrode 20 is disposed in power feeding portion E1, in a region of power feeding portion E1 in which second metal layer 21b is disposed, second metal layer 21b may have maximum width $W_{21b}$ less than or equal to maximum width $W_{E1}$ of power feeding portion E1 and greater than maximum width $W_{E2}$ of extension portion E2.

Figure 8:
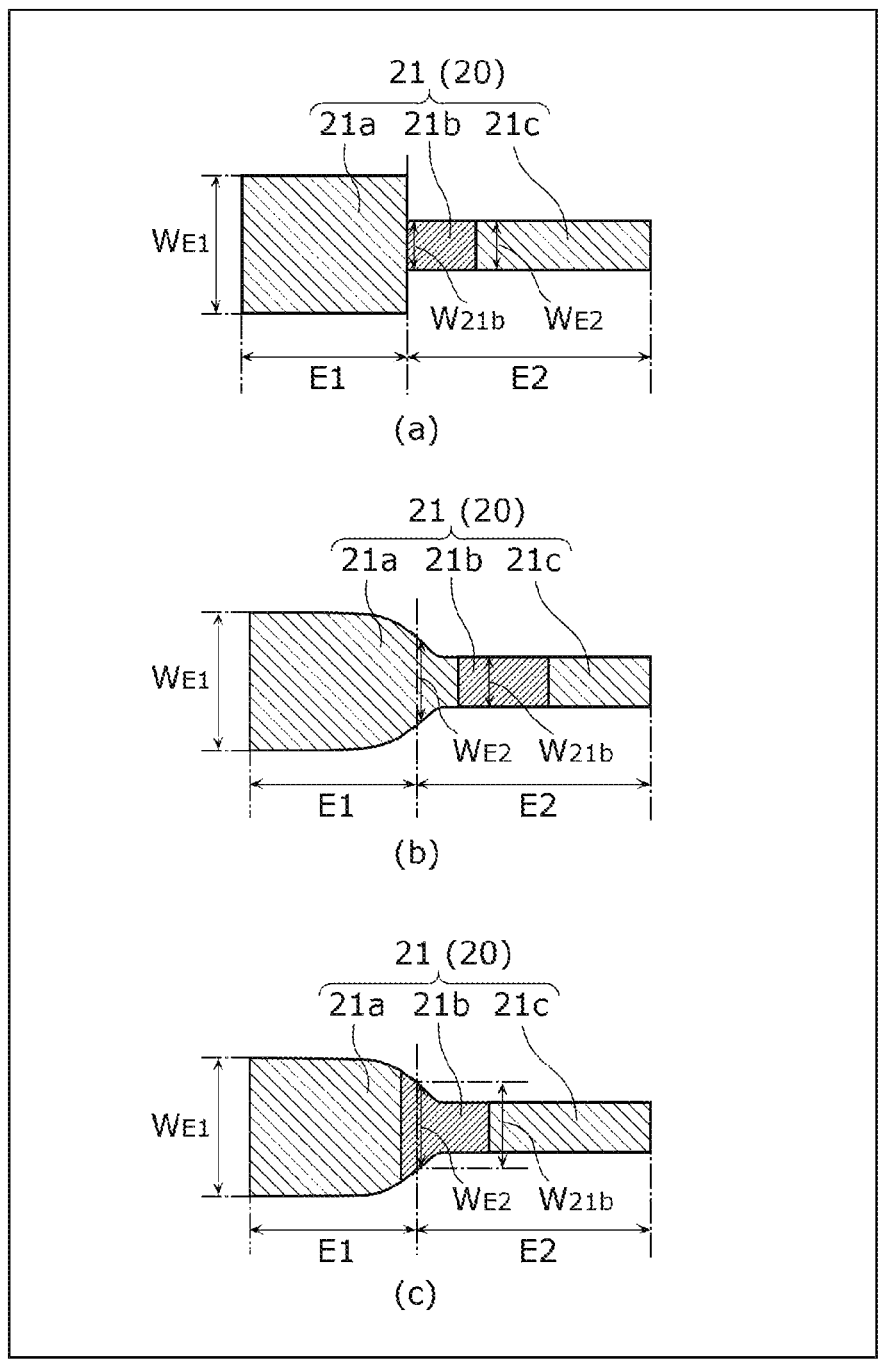
FIG. 8 is a diagram illustrating still another variation of the n-side electrode layer in the n-side electrode of the semiconductor light-emitting element according to Embodiment 1.

Furthermore, as shown by (a) to (c) in FIG. 8, when at least part of second metal layer 21b of n-side electrode layer 21 in n-side electrode 20 is disposed in extension portion E2, in a region of extension portion E2 in which second metal layer 21b is disposed, second metal layer 21b may have maximum width $W_{21b}$ less than or equal to maximum width $W_{E2}$ of extension portion E2 and less than maximum width $W_{E1}$ of power feeding portion E1.

Here, as shown by FIG. 3, when the width of n-side electrode 20X varies discontinuously, the extension portion E2 side at the width varying position has the highest current density. In view of this, as shown by FIG. 5, disposing second metal layer 21b in the region including the width varying position makes it possible to bypass to n-side wiring layer 22 part of the current in the region of n-side electrode 20 in which second metal layer 21b is disposed, it is possible to reduce a current density peak value in the lateral direction (extension direction) in n-side electrode 20. Conversely, when second metal layer 21b is disposed in a region including no width varying positions and extending from a position very close to a width varying position on the extension portion E2 side (e.g., a distance of at most 10 μm from the width varying position) to extension portion E2, n-side electrode 20 cannot reduce a lateral current density at the position very close to the width varying position to a desired value, regardless of an area of the region. Moreover, since a current density decreases at a position beyond the width varying position in a direction opposite to the extension direction due to an increase in width of n-side electrode 20 even when second metal layer 21b is disposed, second metal layer 21b need not be disposed far at the position beyond the width varying position in the direction opposite to the extension direction, compared to a position beyond the width varying position in the extension direction.

Figure 9:
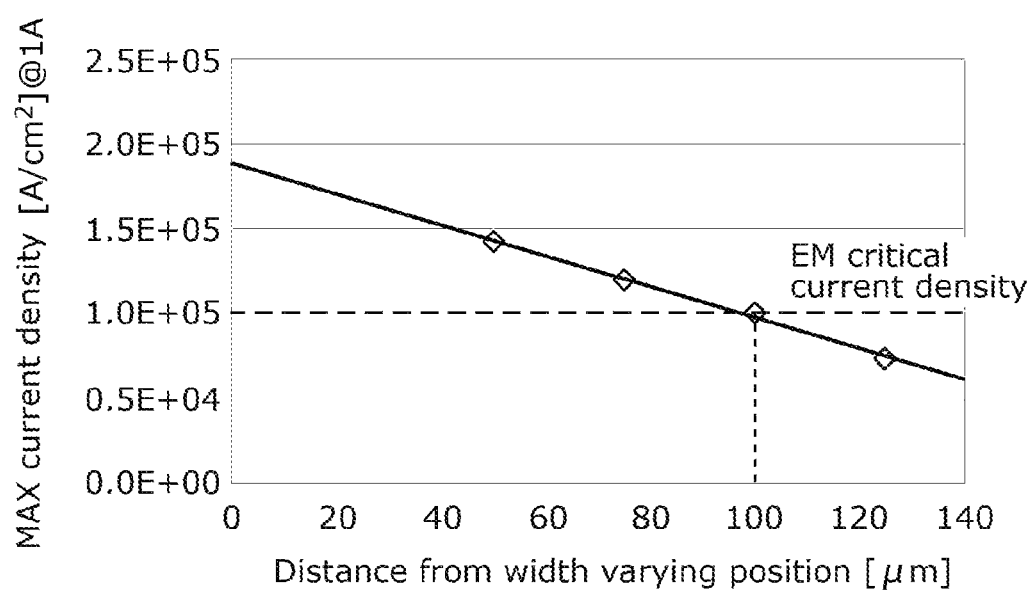
FIG. 9 is a diagram illustrating a relationship between a current density and a distance along the extension direction of the extension portion and from a position (a width varying position) at which a width of the n-side electrode varies, in the n-side electrode layer of the n-side electrode of the semiconductor light-emitting element according to Embodiment 1.

FIG. 9 is a graph showing the maximum current density of n-side electrode 20 at each measurement position in extension portion E2 when 0.5 mm square semiconductor light-emitting element 1 is driven with 1A. As shown by (a) in FIG. 1, in n-side electrode 20, power feeding portion E1 is disposed along the outer periphery of semiconductor light-emitting element 1, and extension portion E2 extends from power feeding portion E1 toward the central part of semiconductor light-emitting element 1. The maximum current density at each point was calculated with the n-side electrode including an aluminum layer having a thickness of 1.2 μm, extension portion E2 having a width of 50 μm, and a measurement position in extension portion E2 changed. As shown by FIG. 9, the lateral maximum current density up to a distance of 100 μm from a width carrying position exceeded a value ($1 \times 10^5$ [A/cm$^2$]) that may possibly cause electromigration of aluminum. For this reason, by disposing second metal layer 21b comprising titanium up to a position within 100 μm from the width varying position relative to the extension direction, it is possible to cause the lateral maximum current density to be less than or equal to the value that causes electromigration. Since the maximum current density may be caused to fall into a range that does not cause electromigration at the time of actual use, an arrangement range of second metal layer 21b may be appropriately set according to conditions such as the configuration of semiconductor light-emitting element 1, a material of n-side electrode 20, or the width of extension portion E2, etc.

Here, when the width of n-side electrode 20 varies smoothly as shown by FIG. 6, a width varying position is defined as position x which is along a direction from power feeding portion E1 to extension portion E2 and at which a differential value (dL/dx) of width L of n-side electrode layer 21 is minimum. When the width of extension portion E2 is constant, among regions having the constant width, a region closest to a power feeding portion E1 side has the highest current density. In view of this, by disposing second metal layer 21b in a region including a portion having the highest current density and closer to the extension portion E2 side than to the width varying position based on the differential value, it is possible to reduce a lateral current density peak value. In this case, second metal layer 21b need not always be disposed in the width varying position as in the case in which the width of n-side electrode 20 varies discontinuously. Moreover, since an electrode width increases more at the width varying position than at the position at which the maximum current density occurs, and the effect of the increase in electrode width reduces a current density, second metal layer 21b need not be disposed far at a position beyond the width varying position in a direction opposite to the extension direction, compared to a position beyond the width varying position in the extension direction. Since the maximum current density may be caused to fall into a range that does not cause electromigration at the time of actual use, an arrangement range of second metal layer 21b may be appropriately set according to conditions such as the configuration of semiconductor light-emitting element 1, a material of n-side electrode 20, or the width of extension portion E2, etc.

It should be noted that when the width of extension portion E2 varies gradually, a position at which a current density is high changes depending on the shape.

As described above, it is desirable that second metal layer 21b be disposed within the distance of 100 μm from the width varying position along the extension direction.

Figure 10:
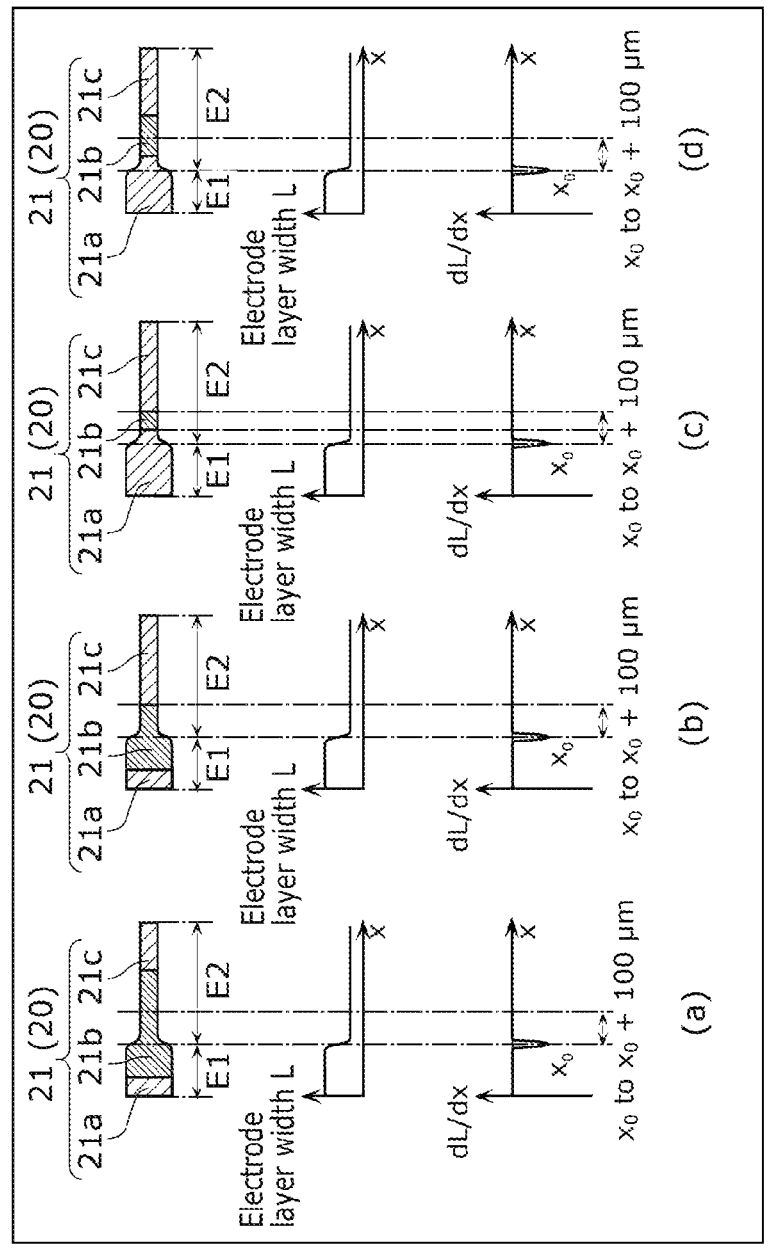
FIG. 10 is a diagram illustrating, for each of variations of the n-side electrode layer of the n-side electrode of the semiconductor light-emitting element according to Embodiment 1, a desired range in which the second metal layer is disposed.

Here, as shown by (a) and (b) in FIG. 10, second metal layer 21b may extend across both power feeding portion E1 and extension portion E2. In this case, as shown by (a) in FIG. 10, second metal layer 21b may extend to a region exceeding 100 μm in the extension direction with reference to position $x_0$ at which the width of n-side electrode layer 21 varies, or as shown by (b) in FIG. 10, second metal layer 21b may extend only to a region within 100 μm in the extension direction with reference to position $x_0$ at which the width of n-side electrode layer 21 varies.

Moreover, as shown by (c) and (d) in FIG. 10, second metal layer 21b may be disposed only in extension portion E2. In this case, as shown by (c) in FIG. 10, second metal layer 21b may be disposed only in a region within 100 μm in the extension direction with reference to position $x_0$ at which the width of n-side electrode layer 21 varies, or as shown by (d) in FIG. 10, second metal layer 21b may extend to a region exceeding 100 μm in the extension direction with reference to position $x_0$ at which the width of n-side electrode layer 21 varies.

Variation 1 of Embodiment 1

Figure 11:
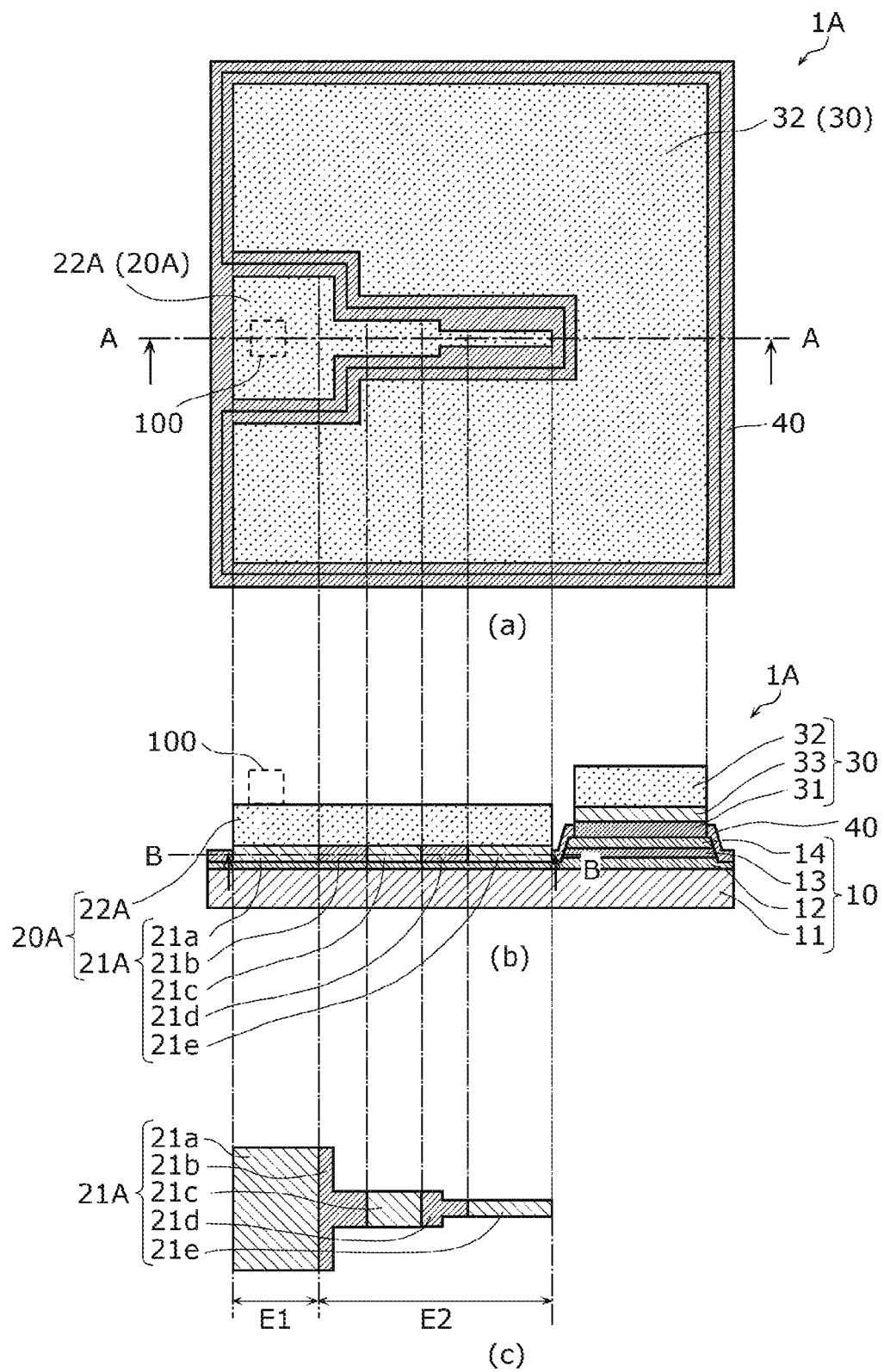
FIG. 11 is a diagram illustrating a configuration of a semiconductor light-emitting element according to Variation 1 of Embodiment 1.

Next, semiconductor light-emitting element 1A according to Variation 1 of Embodiment 1 will be described with reference to FIG. 11. In FIG. 11, (a) is a plan view of semiconductor light-emitting element 1A according to Variation 1 of Embodiment 1, (b) is a vertical cross-sectional view of semiconductor light-emitting element 1A along line A-A shown by (a), and (c) is a horizontal cross-sectional view of semiconductor light-emitting element 1A along line B-B shown by (b).

Semiconductor light-emitting element 1A according to the present variation differs from semiconductor light-emitting element 1 according to Embodiment 1 in a configuration of n-side electrode 20A.

Specifically, as shown by (b) and (c) in FIG. 11, like n-side electrode 20 of semiconductor light-emitting element 1 according to Embodiment 1, n-side electrode 20A of semiconductor light-emitting element 1A according to the present variation includes n-side electrode layer 21A and n-side wiring layer 22A, but n-side electrode layer 21A of n-side electrode 20A in semiconductor light-emitting element 1A according to the present variation includes fourth metal layer 21d and fifth metal layer 21e in addition to first metal layer 21a, second metal layer 21b, and third metal layer 21c.

In the present variation, n-side electrode 20A also includes power feeding portion E1 and extension portion E2, and fourth metal layer 21d is located across third metal layer 21c from second metal layer 21b in extension portion E2. Fourth metal layer 21d is directly connected to third metal layer 21c. In the present variation, fourth metal layer 21d comprises the same material as second metal layer 21b. Specifically, as with second metal layer 21b, fourth metal layer 21d comprises titanium.

Moreover, fifth metal layer 21e is located across fourth metal layer 21d from third metal layer 21c in extension portion E2. Fifth metal layer 21e is directly connected to fourth metal layer 21d. In the present variation, fifth metal layer 21e comprises the same material as first metal layer 21a. Specifically, as with first metal layer 21a and third metal layer 21c, fifth metal layer 21e comprises aluminum.

As with first metal layer 21a, second metal layer 21b, and third metal layer 21c, fourth metal layer 21d and fifth metal layer 21e are in contact with n-type semiconductor layer 12.

Specifically, fourth metal layer 21d and fifth metal layer 21e are in ohmic contact with n-type semiconductor layer 12.

Furthermore, n-side electrode 20A according to the present variation has positions at which a width varies (width varying positions). Accordingly, each of n-side electrode layer 21A and n-side wiring layer 22A has width varying positions.

Specifically, n-side electrode 20A according to the present variation has a width varying position at the boundary between power feeding portion E1 and extension portion E2 as with n-side electrode 20 according to Embodiment 1, and a width varying position in a portion of extension portion E2. In other words, n-side electrode 20A according to the present variation has a width that varies in two stages, and has two width varying positions.

In the present variation, the width of extension portion E2 of n-side electrode 20A varies so that the width narrows in steps toward the tip of the extension direction of extension portion E2. In addition, fourth metal layer 21d of n-side electrode layer 21A is disposed close to this width varying position of extension portion E2.

As described above, as with semiconductor light-emitting element 1 according to Embodiment 1, in semiconductor light-emitting element 1A according to the present variation, n-side electrode 20A includes n-side electrode layer 21A and n-side wiring layer 22A disposed on n-side electrode layer 21A, and n-side electrode layer 21A includes first metal layer 21a disposed in power feeding portion E1, and second metal layer 21b disposed closer to an extension portion E2 side than first metal layer 21a is and having an electrical conductivity lower than an electrical conductivity of first metal layer 21a.

Even when a portion having a varying width is disposed in n-side electrode 20A, this configuration can reduce electromigration while suppressing an increase in driving voltage. In addition, it is possible to suppress a decrease in light extraction efficiency.

Furthermore, n-side electrode 20A in semiconductor light-emitting element 1A according to the present variation has width varying positions relative to a current path direction, and a metal layer having an electrical conductivity lower than the electrical conductivity of first metal layer 21a is disposed at each of the width varying positions in n-side electrode layer 21A. Specifically, second metal layer 21b is disposed at one of two width varying positions in n-side electrode layer 21A, and fourth metal layer 21d is disposed at the other of the two width varying positions in n-side electrode layer 21A. Even when n-side electrode 20A includes portions in which a current density is high due to the width varying positions in n-side electrode 20A, this configuration can effectively reduce electromigration while suppressing an increase in driving voltage.

It should be noted that in extension portion E2 of n-side electrode 20A according to the present variation, a portion having a varying width is disposed as a portion of n-side electrode layer 21A having a high current density, and fourth metal layer 21d is disposed in a portion of n-side electrode layer 21A having a varying width in extension portion E2. The present disclosure, however, is not limited to this example. For example, a portion of n-side electrode layer 21A having a high current density may be a bend portion disposed in extension portion E2 of n-side electrode 20A. In the bend portion, electric lines of force become dense, and a current density increases. When the bend portion is disposed in extension portion E2 of n-side electrode layer 21A, fourth metal layer 21d may be disposed close to the bend portion.

Figure 12:
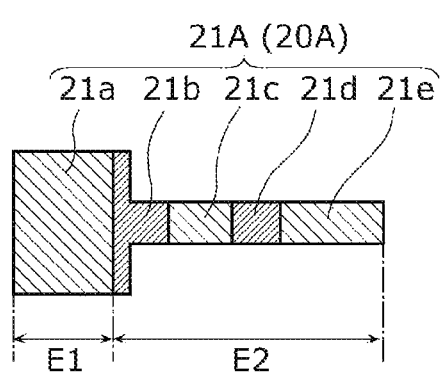
FIG. 12 is a diagram illustrating another configuration of the semiconductor light-emitting element according to Variation 1 of Embodiment 1.

In semiconductor light-emitting element 1A according to the present variation, the portions of extension portion E2 of n-side electrode layer 21A of n-side electrode 20 have the width varying positions. The present disclosure, however, is not limited to this example. As shown by FIG. 12, extension portion E2 of n-side electrode layer 21A need not have a width varying position.

Variation 2 of Embodiment 1

Figure 13:
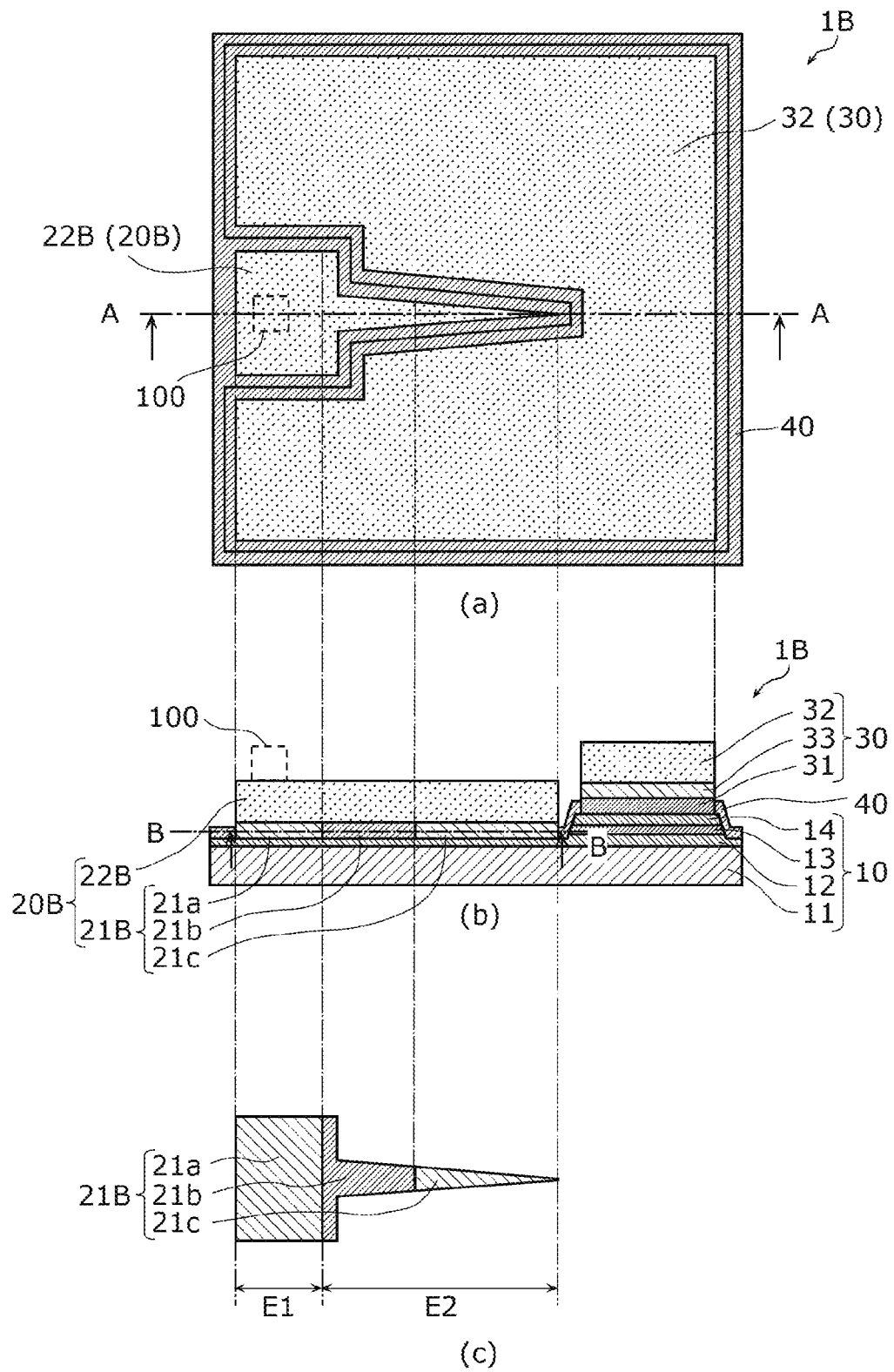
FIG. 13 is a diagram illustrating a configuration of a semiconductor light-emitting element according to Variation 2 of Embodiment 1.

Next, semiconductor light-emitting element 1B according to Variation 2 of Embodiment 1 will be described with reference to FIG. 13. In FIG. 13, (a) is a plan view of semiconductor light-emitting element 1B according to Variation 2 of Embodiment 1, (b) is a vertical cross-sectional view of semiconductor light-emitting element 1B along line A-A shown by (a), and (c) is a horizontal cross-sectional view of semiconductor light-emitting element 1B along line B-B shown by (b).

Semiconductor light-emitting element 1B according to the present variation differs from semiconductor light-emitting element 1 according to Embodiment 1 in a shape of n-side electrode 20B.

Specifically, as shown by (c) in FIG. 13, extension portion E2 of n-side electrode 20B according to the present variation includes a portion having a width less than a width of power feeding portion E1, on the opposite side of power feeding portion E1. In consequence, each of n-side electrode layer 21B and n-side wiring layer 22B in extension portion E2 includes a portion having a width less than the width of power feeding portion E1, on the opposite side of power feeding portion E1.

In the present variation, extension portion E2 of n-side electrode 20B has a width gradually narrowing toward the tip of the extension direction of extension portion E2. Specifically, extension portion E2 of n-side electrode 20B has a taper shape toward the tip of the extension direction of extension portion E2. As a result, each of n-side electrode layer 21B and n-side wiring layer 22B has a taper shape toward the tip of the extension direction of extension portion E2. More specifically, in n-side electrode layer 21B, a portion of second metal layer 21b in extension portion E2 and third metal layer 21c have a substantially isosceles triangular taper shape.

As described above, as with semiconductor light-emitting element 1 according to Embodiment 1, in semiconductor light-emitting element 1B according to the present variation, n-side electrode 20B includes n-side electrode layer 21B and n-side wiring layer 22B disposed on n-side electrode layer 21B, and n-side electrode layer 21B includes first metal layer 21a disposed in power feeding portion E1, and second metal layer 21b disposed closer to an extension portion E2 side than first metal layer 21a is and having an electrical conductivity lower than an electrical conductivity of first metal layer 21a.

Even when a portion having a varying width is disposed in n-side electrode 20B, this configuration can reduce electromigration while suppressing an increase in driving voltage. In addition, it is possible to suppress a decrease in light extraction efficiency.

In addition, in semiconductor light-emitting element 1B according to the present variation, extension portion E2 of n-side electrode 20B includes the portion having the width less than the width of power feeding portion E1, on the opposite side of power feeding portion E1.

Since this configuration can reduce the area of n-side electrode 20B, it is possible to increase an area of p-side electrode 30 (i.e., a light emission area). Accordingly, it is possible to increase light output of semiconductor light-emitting element 1B. In this case, since the amount of current in extension portion E2 of n-side electrode 20B decreases toward the tip of extension portion E2, as in the present variation, decreasing the width of the side (tip) of extension portion E2 opposite to power feeding portion E1 does not result in an increase in current density much, and it is thus possible to suppress the occurrence of electromigration. To put it another way, it is desirable to decrease the area of n-side electrode 20B by thinning the tip of extension portion E2 of n-side electrode 20B to such an extent that the current density does not exceed a critical value of the electromigration, and at the same time to increase the area of p-side electrode 30. As stated above, semiconductor light-emitting element 1B according to the present variation is capable of increasing the light output of semiconductor light-emitting element 1B while maintaining the effectiveness of reducing the electromigration.

Figure 14:
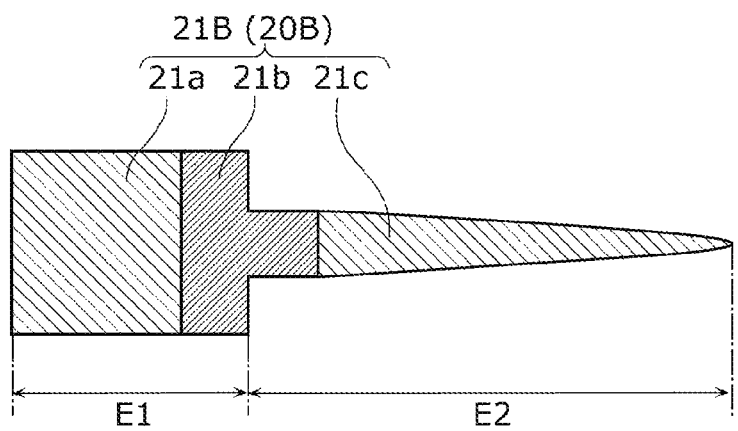
FIG. 14 is a diagram illustrating another configuration of the semiconductor light-emitting element according to Variation 2 of Embodiment 1.

It should be noted that although the whole of extension portion E2 has the taper shape in semiconductor light-emitting element 1B shown by FIG. 13, the present disclosure is not limited to this example. For example, as shown by FIG. 14, a portion (third metal layer 21c in FIG. 14) of extension portion E2 may have a taper shape.

Variation 3 of Embodiment 1

Figure 15:
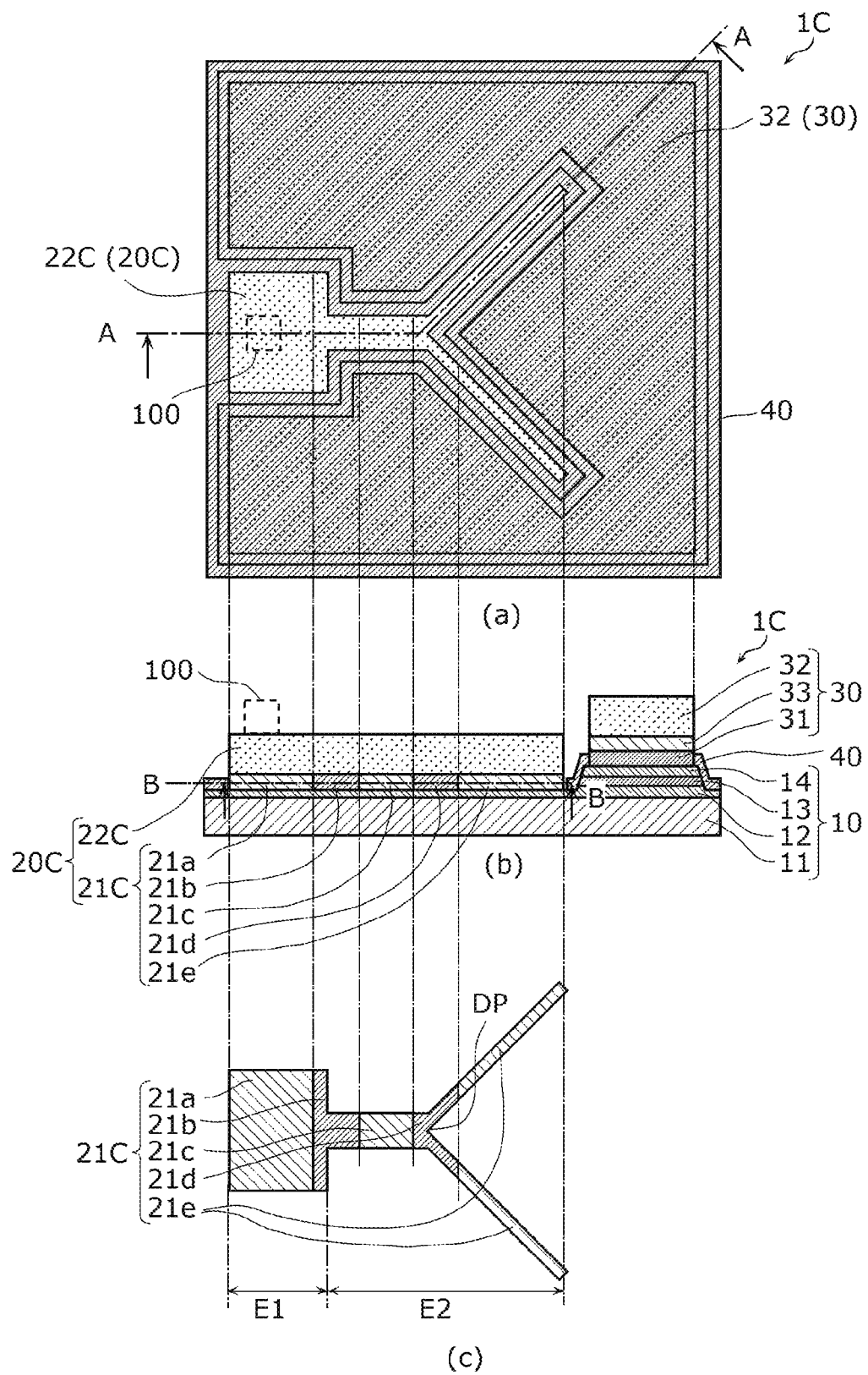
FIG. 15 is a diagram illustrating a configuration of a semiconductor light-emitting element according to Variation 3 of Embodiment 1.

Next, semiconductor light-emitting element 1C according to Variation 3 of Embodiment 1 will be described with reference to FIG. 15. In FIG. 15, (a) is a plan view of semiconductor light-emitting element 1C according to Variation 3 of Embodiment 1, (b) is a vertical cross-sectional view of semiconductor light-emitting element 1C along line A-A shown by (a), and (c) is a horizontal cross-sectional view of semiconductor light-emitting element 1C along line B-B shown by (b).

Semiconductor light-emitting element 1C according to the present variation differs from semiconductor light-emitting element 1 according to Embodiment 1 in a configuration of n-side electrode 20C.

Specifically, as shown by (a) and (c) in FIG. 15, as with n-side electrode 20 of semiconductor light-emitting element 1 according to Embodiment 1, n-side electrode 20C of semiconductor light-emitting element 1C according to the present variation includes n-side electrode layer 21C and n-side wiring layer 22C, but n-side electrode layer 21C of n-side electrode 20C in semiconductor light-emitting element 1C according to the present variation includes fourth metal layer 21d and fifth metal layer 21e in addition to first metal layer 21a, second metal layer 21b, and third metal layer 21c.

Moreover, although n-side electrode 20C also includes power feeding portion E1 and extension portion E2 in the present variation, n-side electrode 20C according to the present variation includes branch portion DP in extension portion E2, on the opposite side of power feeding portion E1. Specifically, in extension portion E2, the electrode is branched into two branch electrodes at branch portion DR By disposing branch portion DP in n-side electrode 20C, it is possible to efficiently supply power to the whole of semiconductor light-emitting element 1C with a small electrode area. It should be noted that in the present variation, widths of electrodes (branch electrodes) after branching at branch portion DP are less than a width of the electrode branched at branch portion DP.

Fourth metal layer 21d is located across third metal layer 21c from second metal layer 21b in extension portion E2. Fourth metal layer 21d is disposed in branch portion DP. In addition, fourth metal layer 21d is directly connected to third metal layer 21c. In the present variation, fourth metal layer 21$d$ comprises the same material as second metal layer 21$b$. Specifically, as with second metal layer 21$b$, fourth metal layer 21$d$ comprises titanium.

Moreover, fifth metal layer 21$e$ is located across fourth metal layer 21$d$ from third metal layer 21$c$ in extension portion E2. Fifth metal layer 21$e$ is disposed in the branch electrodes after branching at branch portion DP. Fifth metal layer 21$e$ is directly connected to fourth metal layer 21$d$. In the present variation, fifth metal layer 21$e$ comprises the same material as first metal layer 21$a$. Specifically, as with first metal layer 21$a$ and third metal layer 21$c$, fifth metal layer 21$e$ comprises aluminum.

As with first metal layer 21$a$, second metal layer 21$b$, and third metal layer 21$c$, fourth metal layer 21$d$ and fifth metal layer 21$e$ are in contact with n-type semiconductor layer 12. Specifically, fourth metal layer 21$d$ and fifth metal layer 21$e$ are in ohmic contact with n-type semiconductor layer 12.

As described above, as with semiconductor light-emitting element 1 according to Embodiment 1, in semiconductor light-emitting element 1C according to the present variation, n-side electrode 20C includes n-side electrode layer 21C and n-side wiring layer 22C disposed on n-side electrode layer 21C, and n-side electrode layer 21C includes first metal layer 21$a$ disposed in power feeding portion E1, and second metal layer 21$b$ disposed closer to an extension portion E2 side than first metal layer 21$a$ is and having an electrical conductivity lower than an electrical conductivity of first metal layer 21$a$.

Even when a portion having a varying width is disposed in n-side electrode 20C, this configuration can reduce electromigration while suppressing an increase in driving voltage. In addition, it is possible to suppress a decrease in light extraction efficiency.

In addition, n-side electrode 20C in semiconductor light-emitting element 1C according to the present variation includes branch portion DP on the opposite side of power feeding portion E1, in extension portion E2. A current density of n-side electrode layer 21C increases in the portion of n-side electrode 20C in which branch portion DP is disposed. For example, when the sum of the widths of the electrodes (branch electrodes) after branching at branch portion DP is less than the width of the electrode before branching, a current density in branch portion DP increases.

In view of this, in n-side electrode 20C in semiconductor light-emitting element 1C according to the present variation, fourth metal layer 21$d$ is disposed in branch portion DP of n-side electrode layer 21C.

Even when branch portion DP is located in n-side electrode 20C, this configuration can effectively reduce electromigration while suppressing an increase in driving voltage.

It should be noted that although branch portion DP is disposed in extension portion E2 of n-side electrode 20C so that extension portion E2 has a Y shape according to the present variation, the present disclosure is not limited to this example. For example, branch portion DP may be disposed in extension portion E2 of n-side electrode 20C so that extension portion E2 has a T shape. In this case, since branch portion DP is a bend portion even when the sum of electrode widths is equal before and after branching, in branch portion DP, electric lines of force become dense, and a current density increases. Accordingly, even when T-shaped branch portion DP is disposed in extension portion E2 of n-side electrode 20C, it is possible to effectively reduce electromigration by disposing fourth metal layer 21$d$ in branch portion DP of n-side electrode layer 21C.

It should be noted that at least a portion of fourth metal layer 21$d$ disposed in branch portion DP may be located in a region within ±100 μm in a branch direction with reference to the center of branch portion DP.

Figure 16:
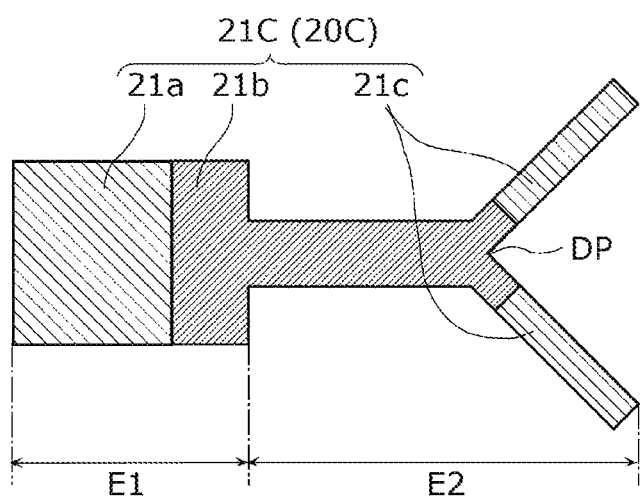
FIG. 16 is a diagram illustrating another configuration of the semiconductor light-emitting element according to Variation 3 of Embodiment 1.

Moreover, although fourth metal layer 21$d$ is disposed in branch portion DP of n-side electrode layer 21C in semiconductor light-emitting element 1C according to the present variation, the present disclosure is not limited to this example. For example, as shown by FIG. 16, when n-side electrode layer 21C does not include fourth metal layer 21$d$ and fifth metal layer 21$e$ and includes only first metal layer 21$a$, second metal layer 21$b$, and third metal layer 21$c$, second metal layer 21$b$ may be disposed in branch portion DP of n-side electrode layer 21C.

Figure 17:
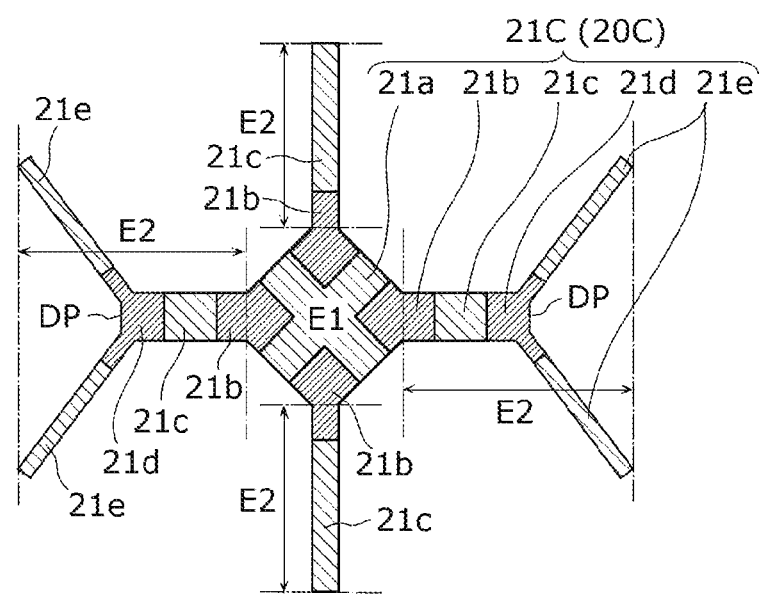
FIG. 17 is a diagram illustrating still another configuration of the semiconductor light-emitting element according to Variation 3 of Embodiment 1.

Furthermore, although one extension portion E2 extends from power feeding portion E1 in n-side electrode 20C of semiconductor light-emitting element 1C according to the present variation, the present disclosure is not limited to this example. For example, as shown by FIG. 17, plural (four in FIG. 17) extension portions E2 may extend from power feeding portion E1. In this case, fourth metal layer 21$d$ may be disposed in each of branch portions DP of plural extension portions E2 in n-side electrode layers 21C. It should be noted that fourth metal layer 21$d$ need not be disposed in each of all branch portions DP of plural extension portions E2. In this case, at least a portion of second metal layer 21$b$ may be located in a region within ±100 μm in a branch direction with reference to the center of branch portion DP.

Variation 4 of Embodiment 1

Figure 18:
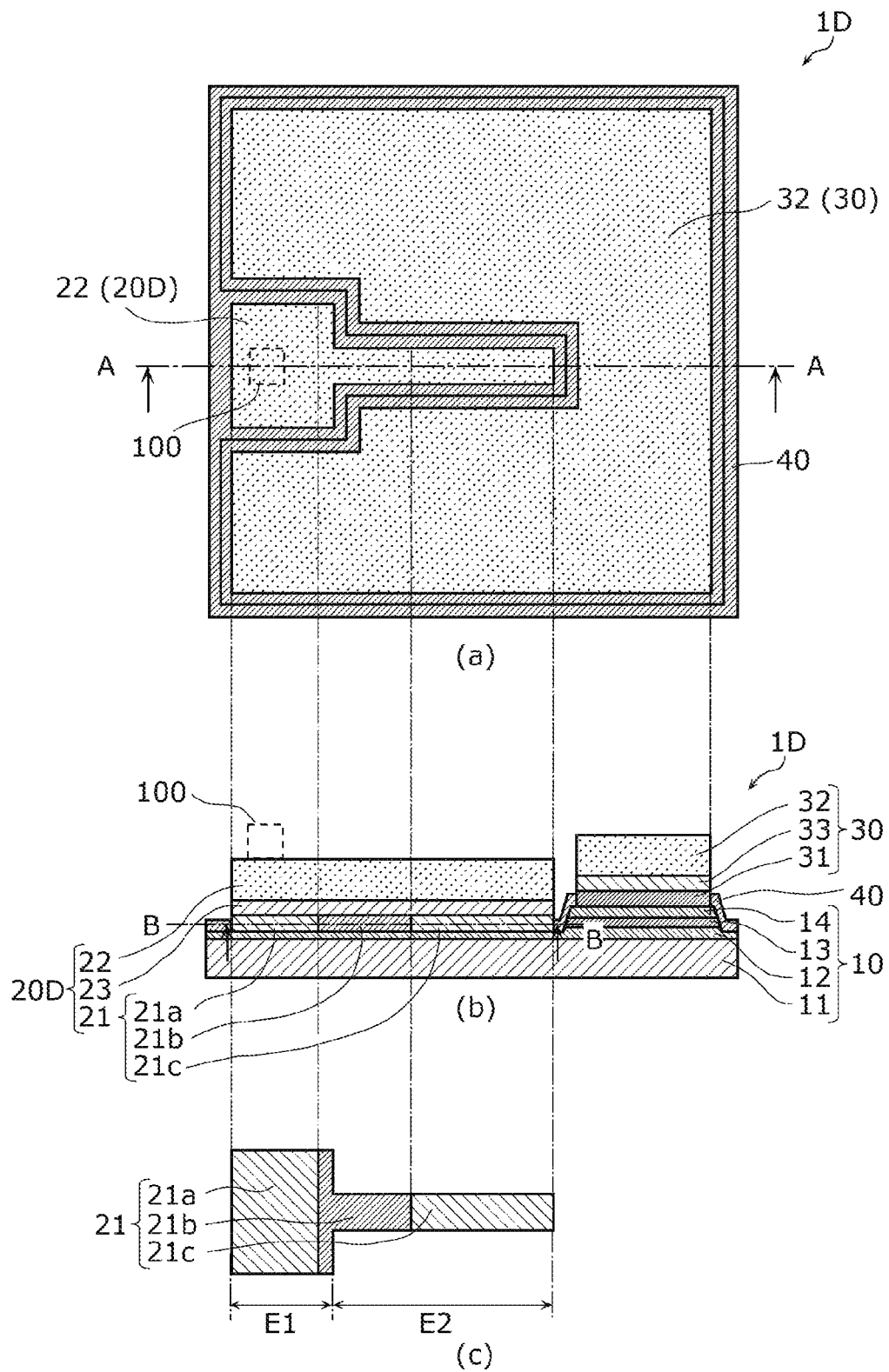
FIG. 18 is a diagram illustrating a configuration of a semiconductor light-emitting element according to Variation 4 of Embodiment 1.

Next, semiconductor light-emitting element 1D according to Variation 4 of Embodiment 1 will be described with reference to FIG. 18. In FIG. 18, (a) is a plan view of semiconductor light-emitting element 1D according to Variation 4 of Embodiment 1, (b) is a vertical cross-sectional view of semiconductor light-emitting element 1D along line A-A shown by (a), and (c) is a horizontal cross-sectional view of semiconductor light-emitting element 1D along line B-B shown by (b).

Semiconductor light-emitting element 1D according to the present variation differs from semiconductor light-emitting element 1 according to Embodiment 1 in a configuration of n-side electrode 20D.

Specifically, as shown by (b) in FIG. 18, n-side electrode 20D of semiconductor light-emitting element 1D according to the present variation differs from n-side electrode 20 of semiconductor light-emitting element 1 according to Embodiment 1 in further including n-side diffusion barrier layer 23. In other words, n-side electrode 20D according to the present variation includes n-side diffusion barrier layer 23 in addition to n-side electrode layer 21 and n-side wiring layer 22.

n-side diffusion barrier layer 23 is disposed between n-side electrode layer 21 and n-side wiring layer 22. In the present variation, n-side diffusion barrier layer 23 is in contact with each of n-side electrode layer 21 and n-side wiring layer 22. The present disclosure, however, is not limited to this example. n-side diffusion barrier layer 23 suppresses mutual diffusion of a metal material included in n-side electrode layer 21 and a metal material included in n-side wiring layer 22. For example, n-side diffusion barrier layer 23 suppresses mutual diffusion of aluminum included in n-side electrode layer 21 and gold included in n-side wiring layer 22.

n-side diffusion barrier layer 23 can be formed of, for example, at least one type of a metal material selected from titanium (Ti), molybdenum (Mo), chrome (Cr), platinum (Pt), nickel (Ni), and tungsten (W), or an alloy including at least one type of a metal material selected from those.

In one instance, when first metal layer 21a and third metal layer 21c of n-side electrode layer 21 are each an Al layer (a thickness of 0.3 μm), second metal layer 21b of n-side electrode layer 21 is a Ti layer (a thickness of 0.3 μm), and n-side wiring layer 22 is an Au layer (a thickness of 1.0 μm), n-side diffusion barrier layer 23 is an Mo layer (a thickness of 0.375 μm) comprising molybdenum.

As described above, as with semiconductor light-emitting element 1 according to Embodiment 1, in semiconductor light-emitting element 1D according to the present variation, n-side electrode 20D includes n-side electrode layer 21 and n-side wiring layer 22 disposed on n-side electrode layer 21, and n-side electrode layer 21 includes first metal layer 21a disposed in power feeding portion E1, and second power feeding portion 21b disposed closer to an extension portion E2 side than first metal layer 21a is and having an electrical conductivity lower than an electrical conductivity of first metal layer 21a.

Even when a portion having a varying width is disposed in n-side electrode 20D, this configuration can reduce electromigration while suppressing an increase in driving voltage. In addition, it is possible to suppress a decrease in light extraction efficiency.

Moreover, n-side electrode 20D in semiconductor light-emitting element 1D according to the present variation includes n-side diffusion barrier layer 23 between n-side electrode layer 21 and n-side wiring layer 22.

With this configuration, n-side diffusion barrier layer 23 is capable of suppressing the mutual diffusion of the metal material included in n-side electrode layer 21 and the metal material included in n-side wiring layer 22. Accordingly, it is possible to achieve semiconductor light-emitting element 1D that excels in long-term reliability.

Figure 19:
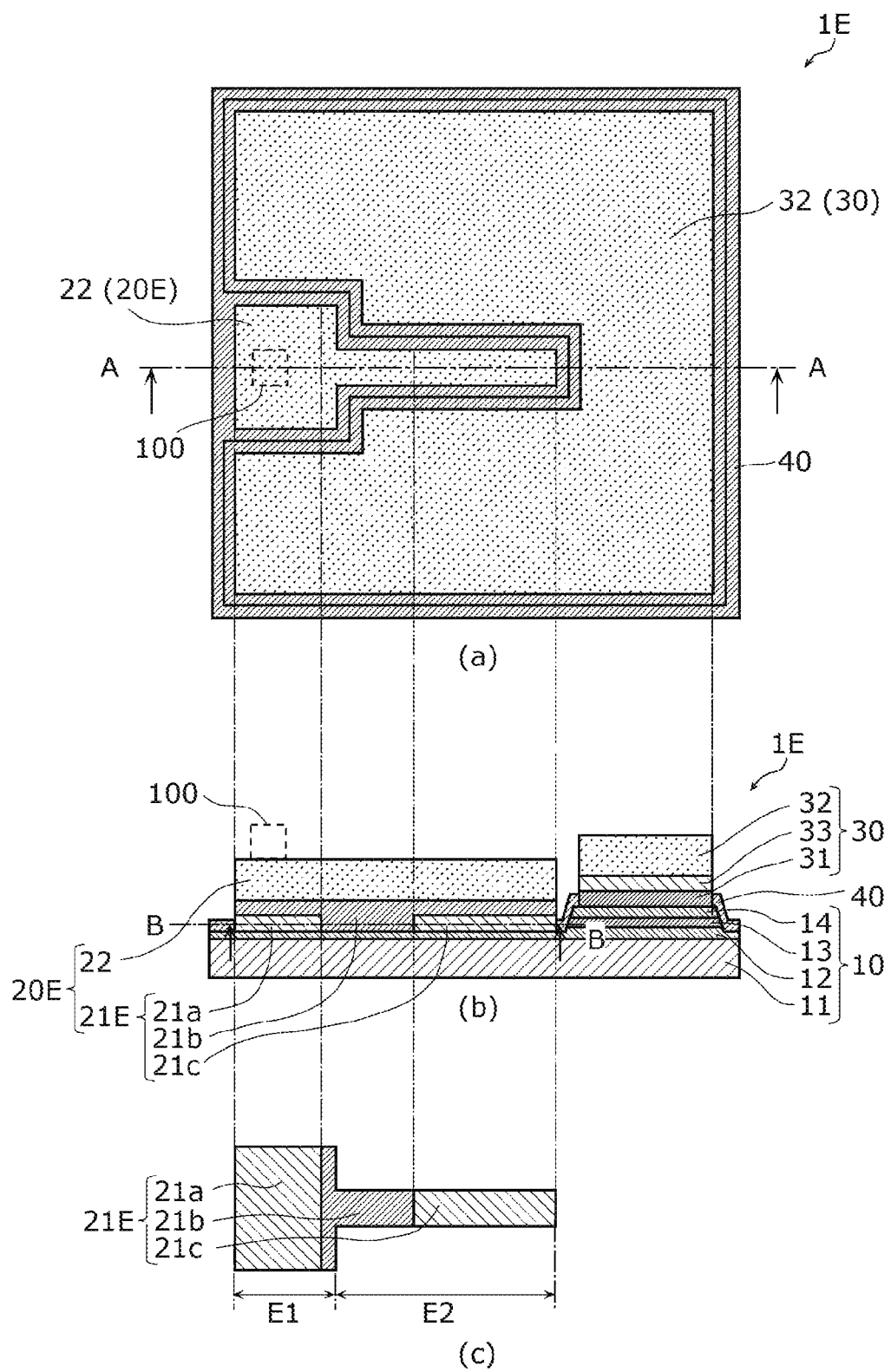
FIG. 19 is a diagram illustrating another configuration of the semiconductor light-emitting element according to Variation 4 of Embodiment 1.

It should be noted that although n-side diffusion barrier layer 23 and n-side electrode layer 21 comprise different materials in semiconductor light-emitting element 1D according to the present variation, the present disclosure is not limited to this example. For example, n-side diffusion barrier layer 23 may comprise the same material as second metal layer 21b of n-side electrode layer 21. In this case, second metal layer 21b of n-side electrode layer 21 and n-side diffusion barrier layer 23 may be integrated with each other to allow second metal layer 21b of n-side electrode layer 21E to serve as an n-side diffusion barrier layer, like n-side electrode 20E of semiconductor light-emitting element 1E shown by FIG. 19. In semiconductor light-emitting element 1E shown by FIG. 19, second metal layer 21b of n-side electrode layer 21E is a Ti layer.

n-side electrode 20E of semiconductor light-emitting element 1E shown by FIG. 19 can be formed by separately forming a Ti layer to be second metal layer 21b of n-side electrode layer 21E and a Ti layer to be an n-side diffusion barrier layer on n-side electrode layer 21E. For example, n-side electrode layer 21E is formed by forming first metal layer 21a, third metal layer 21c (e.g., an Al layer), and second metal layer 21b (e.g., a Ti layer), and then an n-side diffusion barrier layer (e.g., a Ti layer) comprising the same material as second metal layer 21b is formed on n-side electrode layer 21E by EB deposition or sputtering and is made into a predetermined shape by photolithography.

Figure 20:
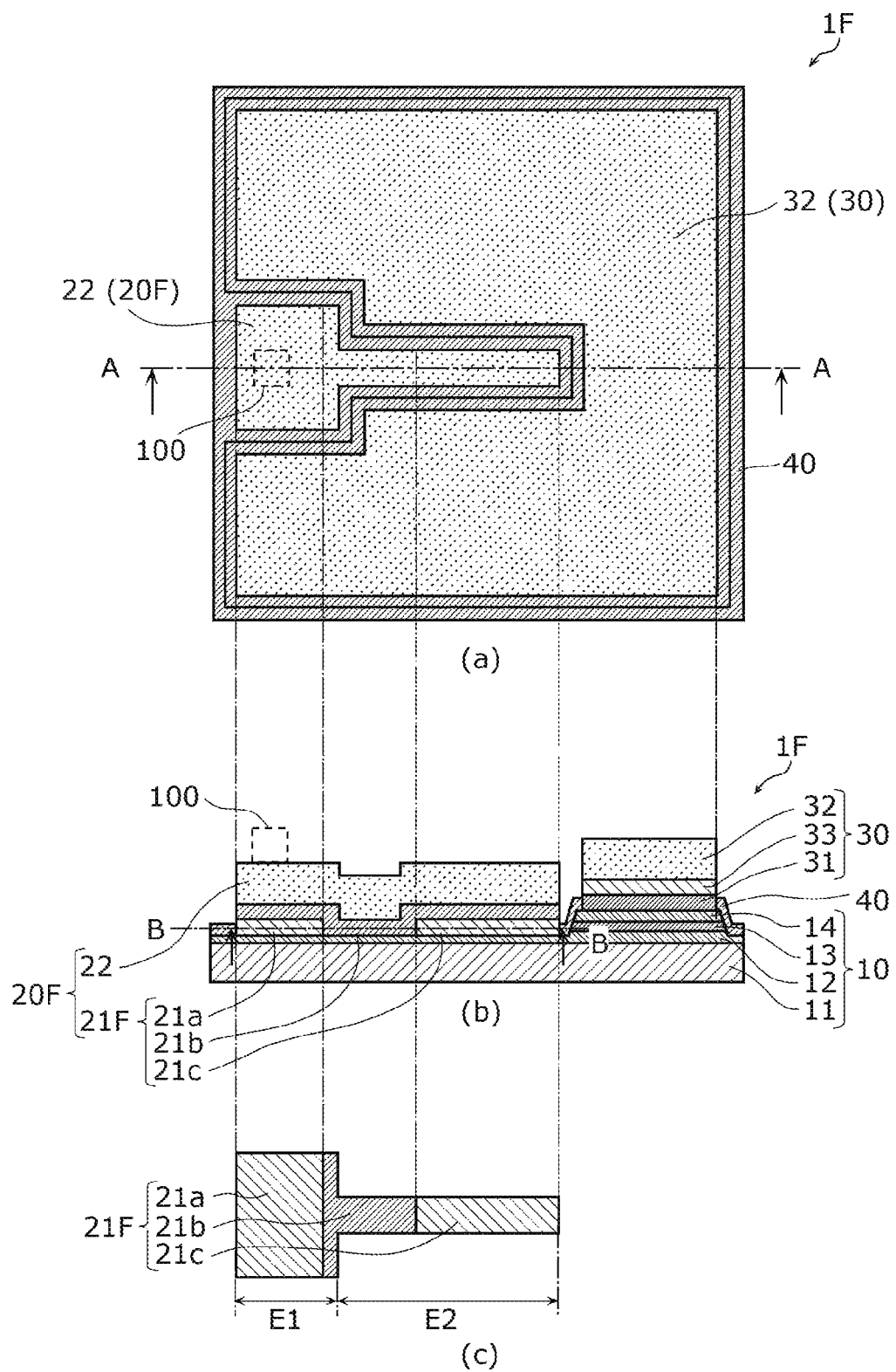
FIG. 20 is a diagram illustrating still another configuration of the semiconductor light-emitting element according to Variation 4 of Embodiment 1.

Moreover, a Ti layer to be second metal layer 21b of n-side electrode layer 21E and a Ti layer to be an n-side diffusion barrier layer on n-side electrode layer 21E may be formed not separately but simultaneously. For example, first metal layer 21a and third metal layer 21c (e.g., an Al layer) are formed into an island shape, and then second metal layer 21b (e.g., a Ti layer) to be an n-side diffusion barrier layer is formed to cover island-shaped first metal layer 21a and third metal layer 21c by EB deposition or sputtering etc. and is made into a predetermined shape by photolithography. As a result, it is possible to form n-side electrode 20F of semiconductor light-emitting element 1F as shown by FIG. 20. To put it another way, each of second metal layer 21b of n-side electrode layer 21F that also serves as the n-side diffusion barrier layer and n-side wiring layer 22 is recessed in a portion between first metal layer 21a and third metal layer 21c that are separated from each other. As stated above, it is possible to reduce the manufacturing process by simultaneously forming second metal layer 21b of n-side electrode layer 21F and the diffusion barrier layer integrally.

Variation 5 of Embodiment 1

Figure 21:
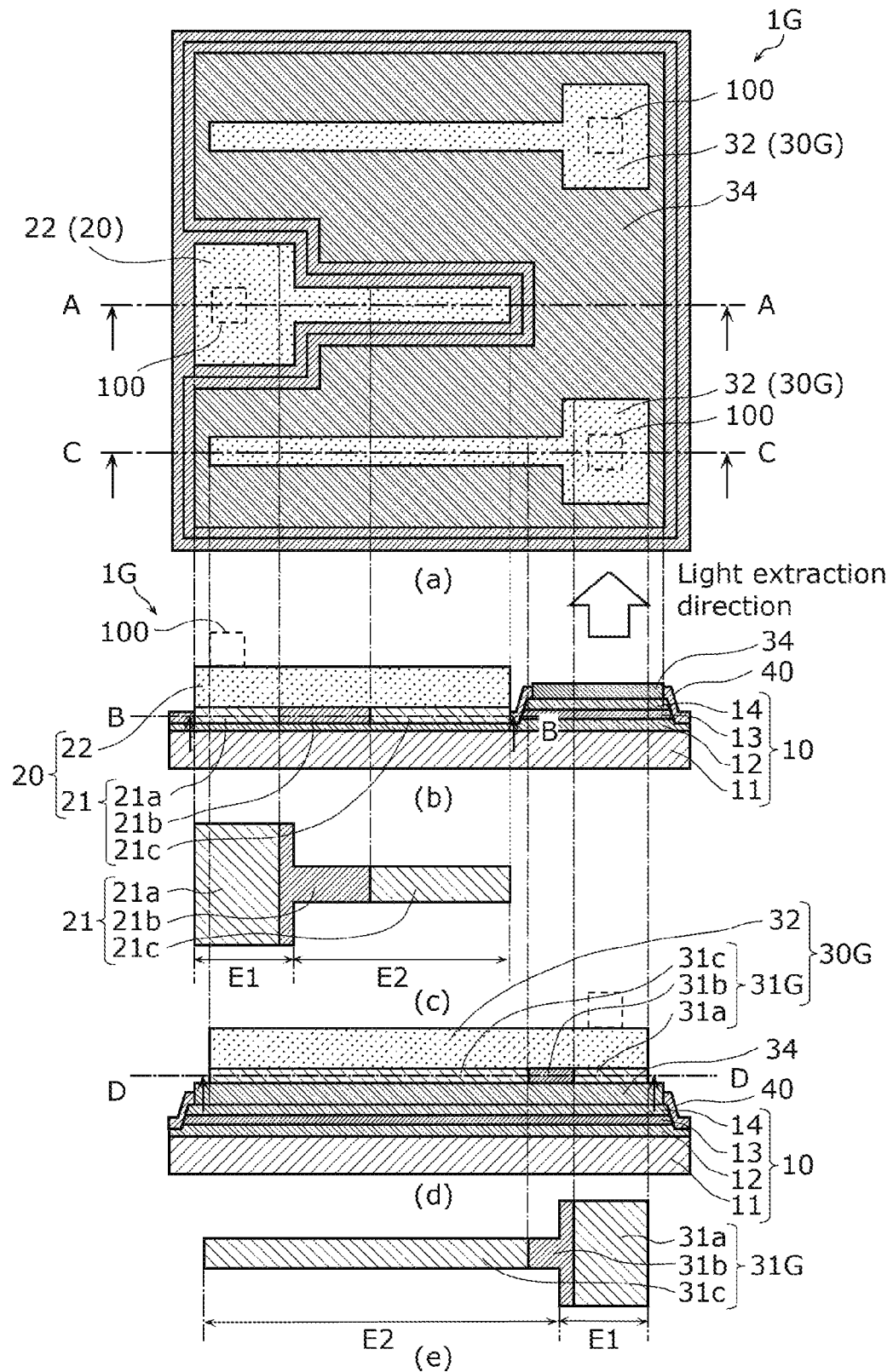
FIG. 21 is a diagram illustrating a configuration of a semiconductor light-emitting element according to Variation 5 of Embodiment 1.

Next, semiconductor light-emitting element 1G according to Variation 5 of Embodiment 1 will be described with reference to FIG. 21. In FIG. 21, (a) is a plan view of semiconductor light-emitting element 1G according to Variation 5 of Embodiment 1, (b) is a vertical cross-sectional view of semiconductor light-emitting element 1G along line A-A shown by (a), (c) is a horizontal cross-sectional view of semiconductor light-emitting element 1G along line B-B shown by (b), (d) is a vertical cross-sectional view of semiconductor light-emitting element 1G along line C-C shown by (a), and (e) is a horizontal cross-sectional view of semiconductor light-emitting element 1G along line D-D shown by (d).

Semiconductor light-emitting element 1G according to the present variation differs from semiconductor light-emitting element 1 according to Embodiment 1 in a configuration of p-side electrode 30G.

Specifically, whereas p-side electrode 30 of semiconductor light-emitting element 1 according to Embodiment 1 is disposed on a p-type GaN layer, as shown by (a), (d), and (e) in FIG. 21, p-side electrode 30G of semiconductor light-emitting element 1G according to the present variation is disposed on oxide semiconductor layer 34.

Oxide semiconductor layer 34 is disposed on p-type semiconductor layer 14. In the present variation, oxide semiconductor layer 34 is in contact with p-type semiconductor layer 14.

Oxide semiconductor layer 34 includes a compound semiconductor. A transparent conductive film including transparent metallic oxide such as indium tin oxide (ITO), indium zinc oxide (IZO), zinc oxide (ZnO), or InGaZnO$_x$ (IGZO) can be used as oxide semiconductor layer 34. This enables the light generated by active layer 13 to pass through oxide semiconductor layer 34 and to be extracted to the outside. In other words, the light generated by active layer 13 is extracted not from a substrate 11 side but from a p-side electrode 30G side. In this case, a light extraction direction of semiconductor light-emitting element 1G is the upward direction shown by FIG. 21. It should be noted that oxide semiconductor layer 34 is an ITO film comprising ITO in the present variation.

Moreover, oxide semiconductor layer 34 may include a thin ohmic contact layer in an interface with p-type semiconductor layer 14. For example, by including one type of a chemical element selected from Ni, Pd, Pt, Cr, Mn, Ta, Cu, and Fe or an alloy etc. including one type of those in a portion of oxide semiconductor layer 34 in contact with p-type semiconductor layer 14, it is possible to reduce a contact resistance value of ohmic contact.

In the present variation, p-side electrode 30G has the same configuration as n-side electrode 20 and includes p-side electrode layer 31G disposed on a p-type semiconductor layer 14 side, and p-side wiring layer 32 disposed on p-side electrode layer 31G. Specifically, p-side electrode layer 31G is stacked on oxide semiconductor layer 34, and p-side wiring layer 32 is stacked on p-side electrode layer 31G. It should be noted that p-side electrode layer 31G and p-side wiring layer 32 have the same shape in a plan view.

As with n-side electrode 20, p-side electrode 30G includes power feeding portion E1 and extension portion E2 extending from power feeding portion E1. Power feeding portion E1 is connected to power feeding terminal 100 in p-side electrode 30G. In p-side electrode 30G, power feeding portion E1 has a width greater than a width of extension portion E2 in a direction orthogonal to an extension direction of extension portion E2. In other words, the width of extension portion E2 is less than the width of power feeding portion E1 in p-side electrode 30G. Accordingly, p-side electrode 30G includes a portion having a varying width. Stated differently, each of p-side electrode layer 31G and p-side wiring layer 32 includes a portion having a varying width.

p-side electrode layer 31G includes first metal layer 31a disposed in power feeding portion E1, and second metal layer 31b disposed closer to an extension portion E2 side than first metal layer 21a is. In the present variation, second metal layer 31b is directly connected to first metal layer 31a. First metal layer 31a and second metal layer 31b comprise a metal material.

p-side electrode layer 31G further includes third metal layer 31c in extension portion E2. Third metal layer 31c comprises a metal material. Third metal layer 31c is located across second metal layer 31b from first metal layer 31a. Accordingly, second metal layer 31b is located between first metal layer 31a and third metal layer 31c in the extension direction of extension portion E2. To put it another way, p-side electrode layer 31G is divided into first metal layer 31a and third metal layer 31c in the extension direction of extension portion E2, and second metal layer 31b is disposed in the divided portion. In the present variation, third metal layer 31c is directly connected to second metal layer 31b.

Second metal layer 31b is disposed close to a position at which the width of p-side electrode layer 31G varies relative to at least the extension direction of extension portion E2. In the present variation, second metal layer 31b is over the position at which the width of p-side electrode layer 31G varies. In other words, second metal layer 31b is disposed both in power feeding portion E1 and extension portion E2.

In p-side electrode 30G, each of first metal layer 31a, second metal layer 31b, and third metal layer 31c is in contact with oxide semiconductor layer 34. Accordingly, first metal layer 31a, second metal layer 31b, and third metal layer 31c may comprise a material that serves as an ohmic contact layer for oxide semiconductor layer 34.

Moreover, first metal layer 31a has an electrical conductivity higher than an electrical conductivity of second metal layer 31b. Furthermore, third metal layer 31c has an electrical conductivity higher than the electrical conductivity of second metal layer 31b. In the present variation, first metal layer 31a and third metal layer 31c comprise the same material.

First metal layer 31a and third metal layer 31c can be formed of at least one type of a metal material selected from, for example, Al and Ag, or an alloy including at least one type of a metal material selected from those. In the present variation, first metal layer 31a and third metal layer 31c comprise aluminum.

Second metal layer 31b having the electrical conductivity lower than the electrical conductivity of each of first metal layer 31a and third metal layer 31c can be formed of at least one type of a metal material selected from, for example, Ti, W, and Cr, or an alloy including at least one type of a metal material selected from those. In the present variation, second metal layer 31b comprises titanium.

Moreover, p-side wiring layer 32 stacked on p-side electrode layer 31G is continuously disposed on first metal layer 31a, second metal layer 31b, and third metal layer 31c of p-side electrode layer 31G. To put it another way, p-side wiring layer 32 continuously extends across power feeding portion E1 and extension portion E2. Power feeding terminal 100 is connected to a portion of p-side wiring layer 32 corresponding to power feeding portion E1.

p-side wiring layer 32 comprises a metal material. p-side wiring layer 32 may have a wiring resistance value lower than a wiring resistance value of p-side electrode layer 31G. In other words, p-side wiring layer 32 may comprise a metal material having a wiring resistance value lower than an average wiring resistance value of p-side electrode layer 31G including first metal layer 31a, second metal layer 31b, and third metal layer 31c. In particular, in extension portion E2, the wiring resistance value of p-side wiring layer 32 may be lower than the wiring resistance value (the average wiring resistance value) of p-side electrode layer 31G. p-side wiring layer 32 can be formed of at least one type of a metal material selected from, for example, Cu, Ag, and Au, or an alloy including at least one type of a metal material selected from those.

Since p-side electrode 30G thus configured has the same configuration as n-side electrode 20, p-side electrode 30G can be formed in the same manner as n-side electrode 20 of semiconductor light-emitting element 1 according to Embodiment 1. In one instance, p-side electrode 30G is disposed on an ITO layer (a thickness of 0.2 µm) that is oxide semiconductor layer 34, first metal layer 31a and third metal layer 31c of p-side electrode layer 31G are each an Al layer (a thickness of 0.3 µm), second metal layer 31b of p-side electrode layer 31G is a Ti layer (a thickness of 0.3 µm), and p-side wiring layer 32 is an Au layer (a thickness of 1.0 µm).

As described above, as with semiconductor light-emitting element 1 according to Embodiment 1, in semiconductor light-emitting element 1G according to the present variation, n-side electrode 20 includes n-side electrode layer 21 and n-side wiring layer 22 disposed on n-side electrode layer 21, and n-side electrode layer 21 includes first metal layer 21a disposed in power feeding portion E1, and second power feeding portion 21b disposed closer to an extension portion E2 side than first metal layer 21a is and having an electrical conductivity lower than an electrical conductivity of first metal layer 21a.

Even when a portion having a varying width is disposed in n-side electrode 20, this configuration can reduce electromigration while suppressing an increase in driving voltage. In addition, it is possible to suppress a decrease in light extraction efficiency.

Moreover, in semiconductor light-emitting element 1G according to the present variation, p-side electrode 30G includes p-side electrode layer 31G and p-side wiring layer 32 disposed on p-side electrode layer 31G, and p-side electrode layer 31G includes first metal layer 31a disposed in power feeding portion E1, and second metal layer 31b disposed closer to the extension portion E2 side than first metal layer 31a is and having an electrical conductivity lower than an electrical conductivity of first metal layer 31a.

Even when a portion having a varying width is disposed in p-side electrode 30G, this configuration can reduce electromigration while suppressing an increase in driving voltage.

It should be noted that although p-side electrode 30G does not include a p-side diffusion barrier layer in semiconductor light-emitting element 1G according to the present variation, as with semiconductor light-emitting element 1 according to Embodiment 1, p-side electrode 30G may include p-side diffusion barrier layer 33. In this case, p-side diffusion barrier layer 33 is disposed between p-side electrode layer 31G and p-side wiring layer 32.

In addition, in semiconductor light-emitting element 1G according to the present variation, the configuration of n-side electrode 20 according to any one of Variations 1 to 5 of Embodiment 1 may be applied to p-side electrode 30G.

Embodiment 2

Figure 22:
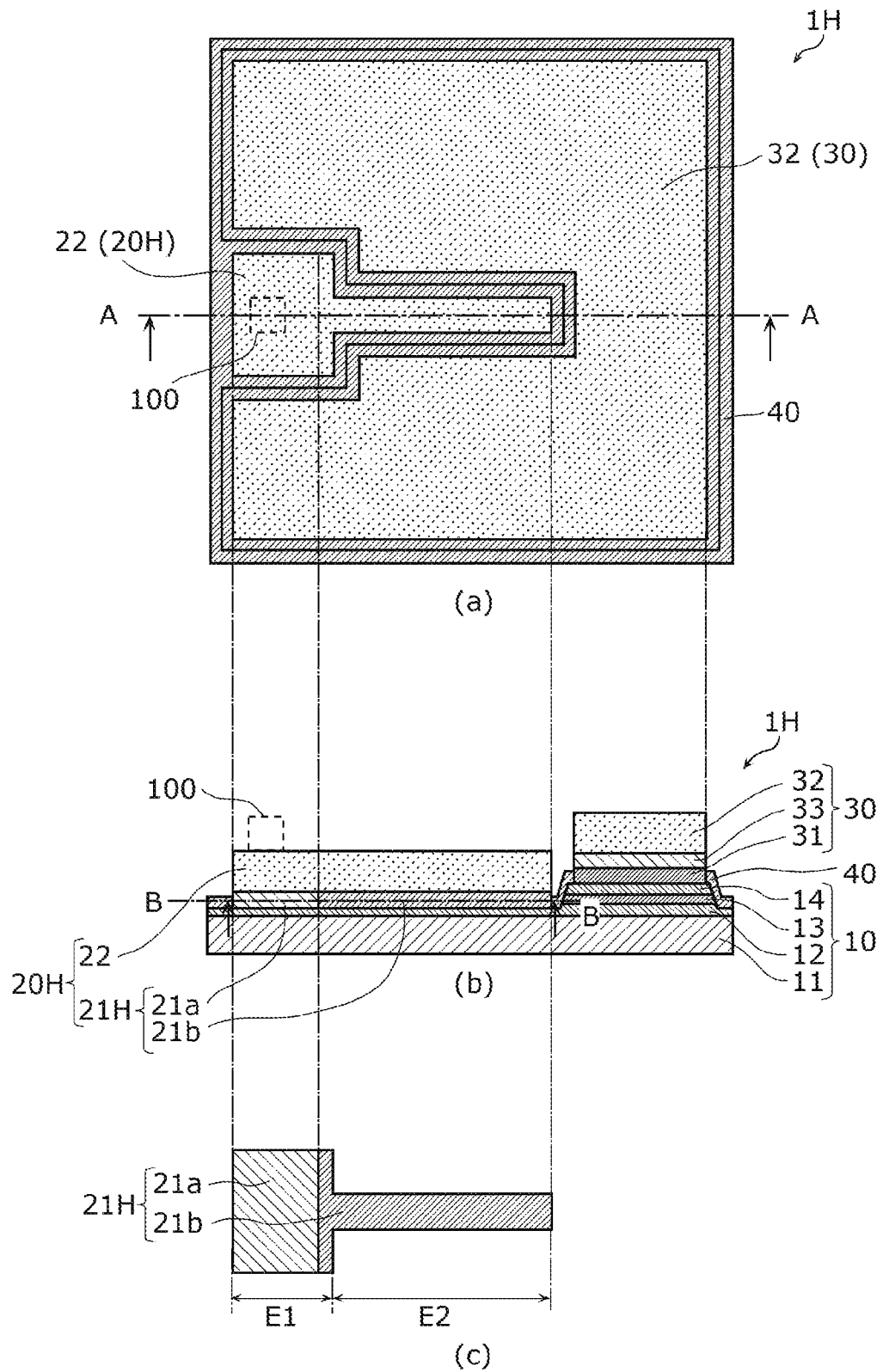
FIG. 22 is a diagram illustrating a configuration of a semiconductor light-emitting element according to Embodiment 2.

Next, semiconductor light-emitting element 1H according to Embodiment 2 will be described with reference to FIG. 22. In FIG. 22, (a) is a plan view of semiconductor light-emitting element 1H according to Embodiment 2, (b) is a vertical cross-sectional view of semiconductor light-emitting element 1H along line A-A shown by (a), and (c) is a horizontal cross-sectional view of semiconductor light-emitting element 1H along line B-B shown by (b).

Semiconductor light-emitting element 1H according to the present embodiment differs from semiconductor light-emitting element 1 according to Embodiment 1 in a configuration of n-side electrode 20H.

Specifically, whereas n-side electrode layer 21 of n-side electrode 20 includes first metal layer 21a, second metal layer 21b, and third metal layer 21c in semiconductor light-emitting element 1 according to Embodiment 1, as shown by (b) and (c) in FIG. 22, in semiconductor light-emitting element 1H according to the present embodiment, n-side electrode layer 21H of n-side electrode 20H does not include third metal layer 21c and includes only first metal layer 21a and second metal layer 21b. In the present embodiment, second metal layer 21b of n-side electrode layer 21H extends across extension portion E2.

As described above, as with semiconductor light-emitting element 1 according to Embodiment 1, in semiconductor light-emitting element 1H according to the present embodiment, n-side electrode 20H includes n-side electrode layer 21H and n-side wiring layer 22 disposed on n-side electrode layer 21H, and n-side electrode layer 21H includes first metal layer 21a disposed in power feeding portion E1, and second metal layer 21b disposed closer to an extension portion E2 side than first metal layer 21a is and having an electrical conductivity lower than an electrical conductivity of first metal layer 21a.

Even when a portion having a varying width is disposed in n-side electrode 20H, this configuration can reduce electromigration while suppressing an increase in driving voltage. In addition, it is possible to suppress a decrease in light extraction efficiency.

Variation 1 of Embodiment 2

Figure 23:
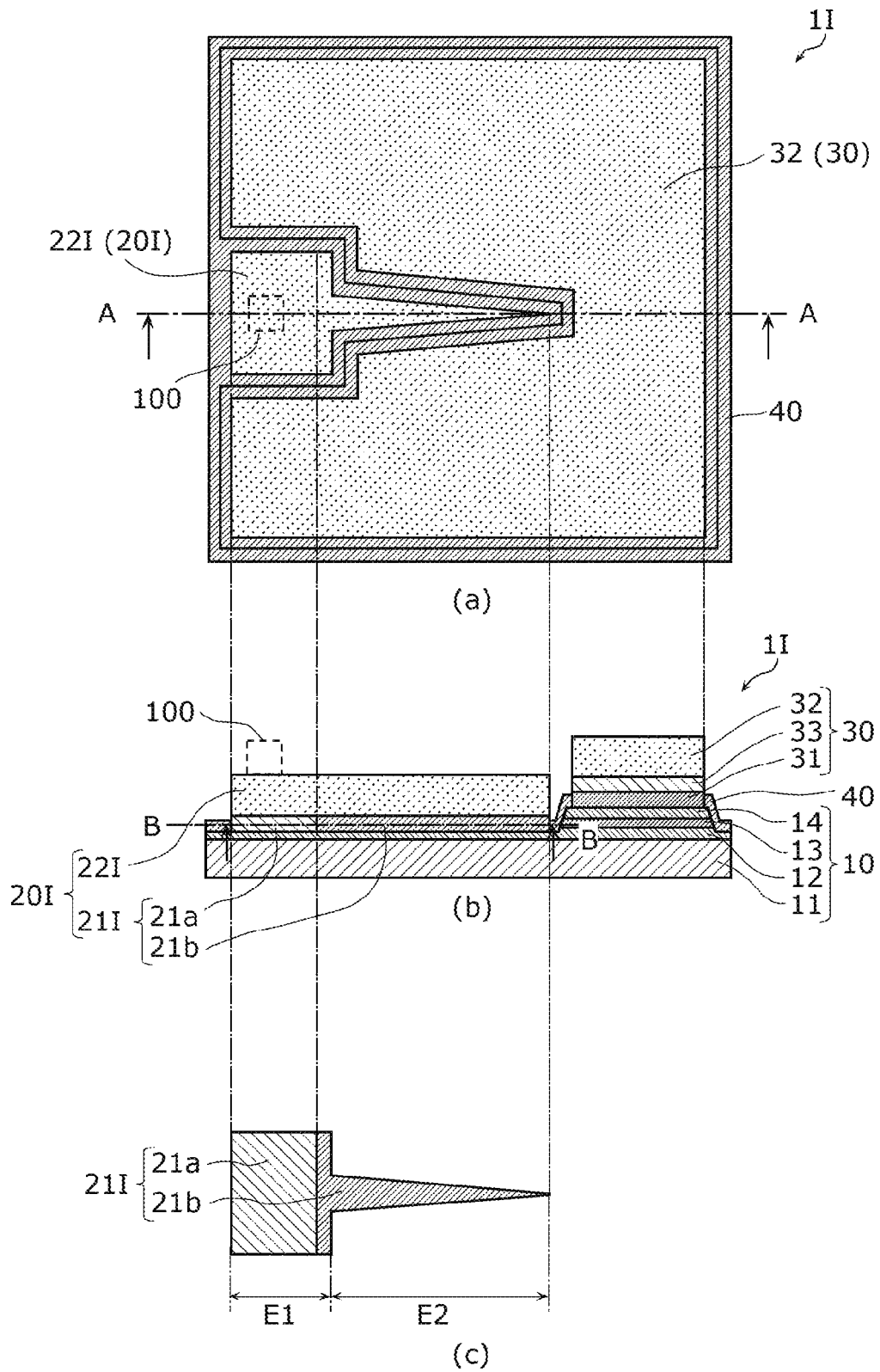
FIG. 23 is a diagram illustrating a configuration of a semiconductor light-emitting element according to Variation 1 of Embodiment 2.

Next, semiconductor light-emitting element 1I according to Variation 1 of Embodiment 2 will be described with reference to FIG. 23. In FIG. 23, (a) is a plan view of semiconductor light-emitting element 1I according to Variation 1 of Embodiment 2, (b) is a vertical cross-sectional view of semiconductor light-emitting element 1I along line A-A shown by (a), and (c) is a horizontal cross-sectional view of semiconductor light-emitting element 1I along line B-B shown by (b).

Semiconductor light-emitting element 1I according to the present variation differs from semiconductor light-emitting element 1H according to Embodiment 2 in a configuration of n-side electrode 20I.

Specifically, as shown by (c) in FIG. 23, as with semiconductor light-emitting element 1B according to Variation 2 of Embodiment 1, extension portion E2 of n-side electrode 20I according to the present variation includes a portion having a width less than a width of power feeding portion E1, on the opposite side of power feeding portion E1. In consequence, each of n-side electrode layer 21I and n-side wiring layer 22I in extension portion E2 includes a portion having a width less than the width of power feeding portion E1, on the opposite side of power feeding portion E1.

In the present variation, extension portion E2 of n-side electrode 20I has a width gradually narrowing toward the tip of the extension direction of extension portion E2. Specifically, extension portion E2 of n-side electrode 20I has a taper shape toward the tip of the extension direction of extension portion E2. As a result, each of n-side electrode layer 21I and n-side wiring layer 22I has a taper shape toward the tip of the extension direction of extension portion E2. More specifically, in n-side electrode layer 21I, a portion of second metal layer 21b in extension portion E2 has a substantially isosceles triangular taper shape.

As described above, as with semiconductor light-emitting element 1H according to Embodiment 2, in semiconductor light-emitting element 1I according to the present variation, n-side electrode 20I includes n-side electrode layer 21I and n-side wiring layer 22I disposed on n-side electrode layer 21I, and n-side electrode layer 21I includes first metal layer 21a disposed in power feeding portion E1, and second metal layer 21b disposed closer to an extension portion E2 side than first metal layer 21a is and having an electrical conductivity lower than an electrical conductivity of first metal layer 21a.

Even when a portion having a varying width is disposed in n-side electrode 20I, this configuration can reduce electromigration while suppressing an increase in driving voltage. In addition, it is possible to suppress a decrease in light extraction efficiency.

In addition, as with semiconductor light-emitting element 1B according to Variation 2 of Embodiment 1, in semiconductor light-emitting element 1I according to the present variation, extension portion E2 of n-side electrode 20I has the portion having the width less than the width of power feeding portion E1, on the opposite side of power feeding portion E1.

This configuration produces the same advantageous effects as semiconductor light-emitting element 1B according to Variation 2 of Embodiment 1. In other words, since it is possible to decrease an area of n-side electrode 20I and increase an area (i.e., a light emission area) of p-side electrode 30, it is possible to increase light output of semiconductor light-emitting element 1I while maintaining the effectiveness of reducing electromigration. Moreover, in this case, since the amount of current in extension portion E2 of n-side electrode 20I decreases toward the tip of extension portion E2, as in the present variation, decreasing the width of the side (tip) of extension portion E2 on the opposite side of power feeding portion E1 does not result in an increase in current density much, and it is thus possible to suppress the occurrence of electromigration.

Variation 2 of Embodiment 2

Figure 24:
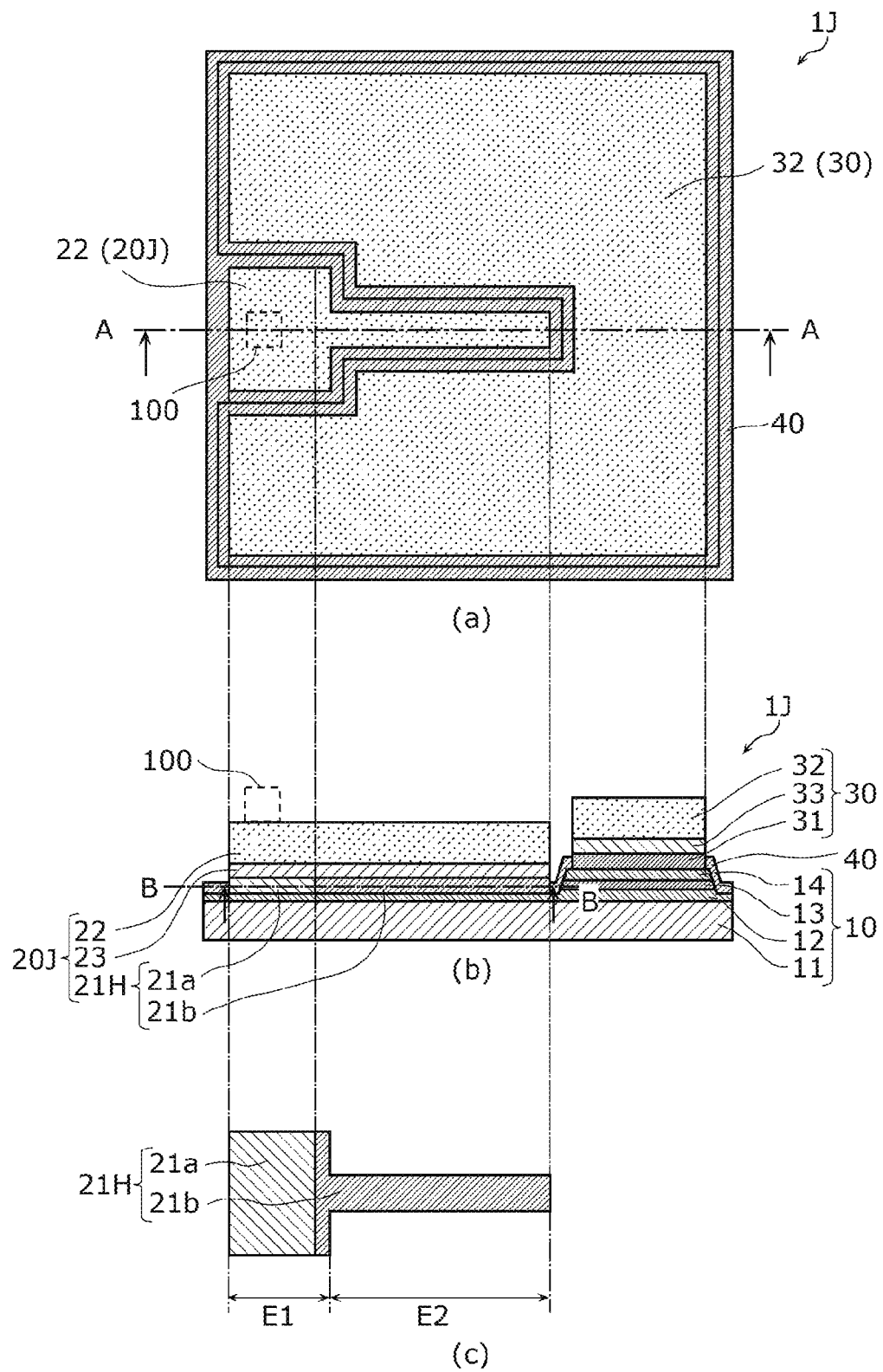
FIG. 24 is a diagram illustrating a configuration of a semiconductor light-emitting element according to Variation 2 of Embodiment 2.

Next, semiconductor light-emitting element 1J according to Variation 2 of Embodiment 2 will be described with reference to FIG. 24. In FIG. 24, (a) is a plan view of semiconductor light-emitting element 1J according to Variation 2 of Embodiment 2, (b) is a vertical cross-sectional view of semiconductor light-emitting element 1J along line A-A shown by (a), and (c) is a horizontal cross-sectional view of semiconductor light-emitting element 1J along line B-B shown by (b).

Semiconductor light-emitting element 1J according to the present variation differs from semiconductor light-emitting element 1H according to Embodiment 2 in a configuration of n-side electrode 20J.

Specifically, as shown by (b) in FIG. 24, n-side electrode 20J of semiconductor light-emitting element 1J according to the present variation differs from n-side electrode 20H of semiconductor light-emitting element 1H according to Embodiment 2 in further including n-side diffusion barrier layer 23. To put it another way, as with semiconductor light-emitting element 1D according to Variation 4 of Embodiment 1, n-side electrode 20J according to the present variation includes, in addition to n-side electrode layer 21H and n-side wiring layer 22, n-side diffusion barrier layer 23 disposed between n-side electrode layer 21H and n-side wiring layer 22.

As described above, as with semiconductor light-emitting element 1H according to Embodiment 2, in semiconductor light-emitting element 1J according to the present variation, n-side electrode 20J includes n-side electrode layer 21H and n-side wiring layer 22 disposed on n-side electrode layer 21H, and n-side electrode layer 21H includes first metal layer 21a disposed in power feeding portion E1, and second metal layer 21b disposed closer to an extension portion E2 side than first metal layer 21a is and having an electrical conductivity lower than an electrical conductivity of first metal layer 21a.

Even when a portion having a varying width is disposed in n-side electrode 20J, this configuration can reduce electromigration while suppressing an increase in driving voltage. In addition, it is possible to suppress a decrease in light extraction efficiency.

Moreover, n-side electrode 20J in semiconductor light-emitting element 1J according to the present variation includes n-side diffusion barrier layer 23 between n-side electrode layer 21H and n-side wiring layer 22.

This configuration produces the same advantageous effects as semiconductor light-emitting element 1D according to Variation 4 of Embodiment 1. In other words, n-side diffusion barrier layer 23 is capable of suppressing mutual diffusion of a metal material included in n-side electrode layer 21H and a metal material included in n-side wiring layer 22. Accordingly, it is possible to achieve semiconductor light-emitting element 1J that excels in long-term reliability.

Figure 25:
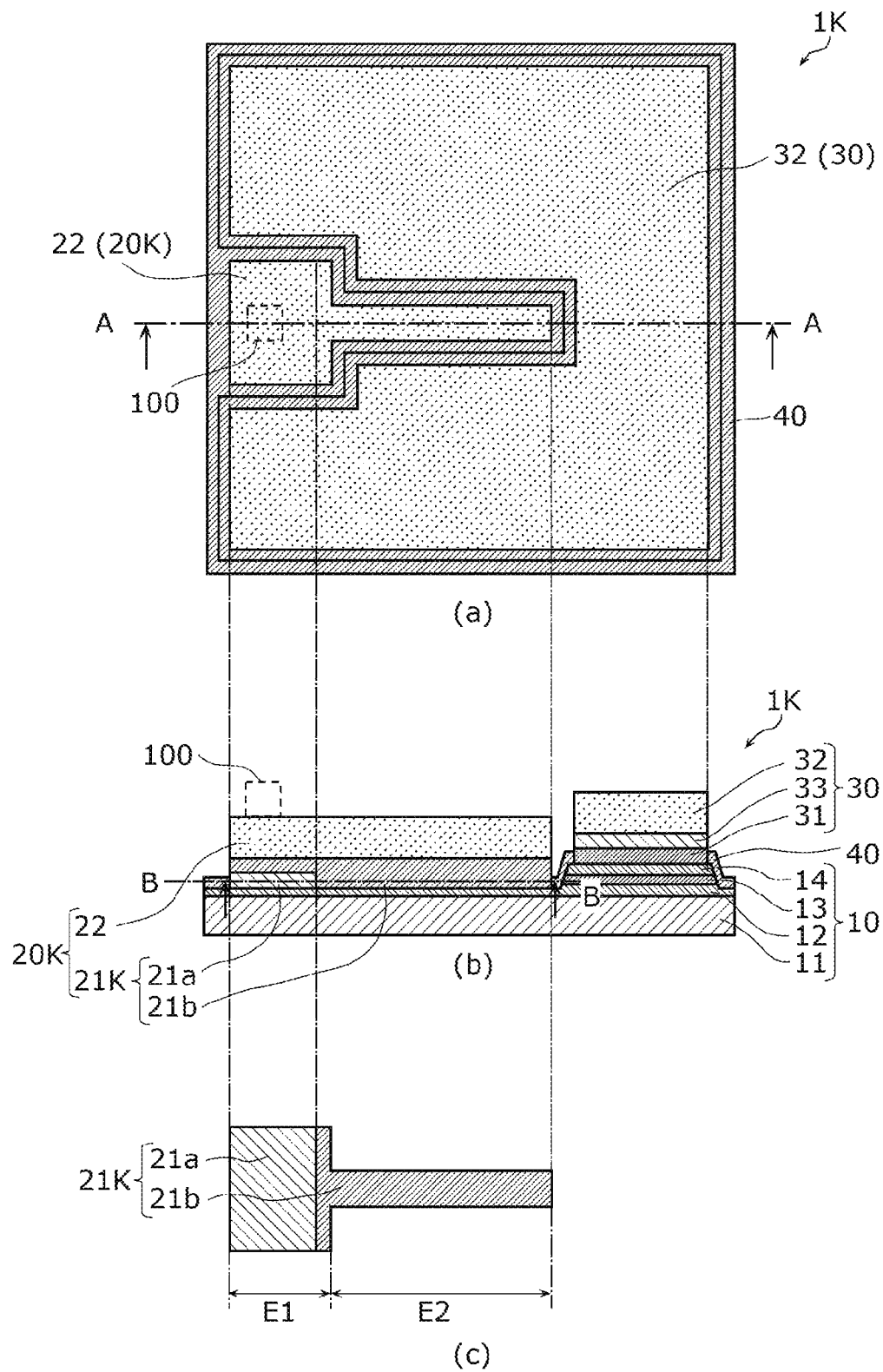
FIG. 25 is a diagram illustrating another configuration of the semiconductor light-emitting element according to Variation 2 of Embodiment 2.

It should be noted that although n-side diffusion barrier layer 23 and n-side electrode layer 21H comprise different materials in semiconductor light-emitting element 1J according to the present variation, the present disclosure is not limited to this example. For example, n-side diffusion barrier layer 23 may comprise the same material as second metal layer 21b of n-side electrode layer 21H. In this case, as with semiconductor light-emitting element 1E shown by FIG. 19, semiconductor light-emitting element 1K as shown by FIG. 25 may include second metal layer 21b of n-side electrode layer 21H and n-side diffusion barrier layer 23 that are integrated with each other. In other words, as with n-side electrode 20K of semiconductor light-emitting element 1K shown by FIG. 25, second metal layer 21b of n-side electrode layer 21K may be allowed to serve as an n-side diffusion barrier layer.

Figure 26:
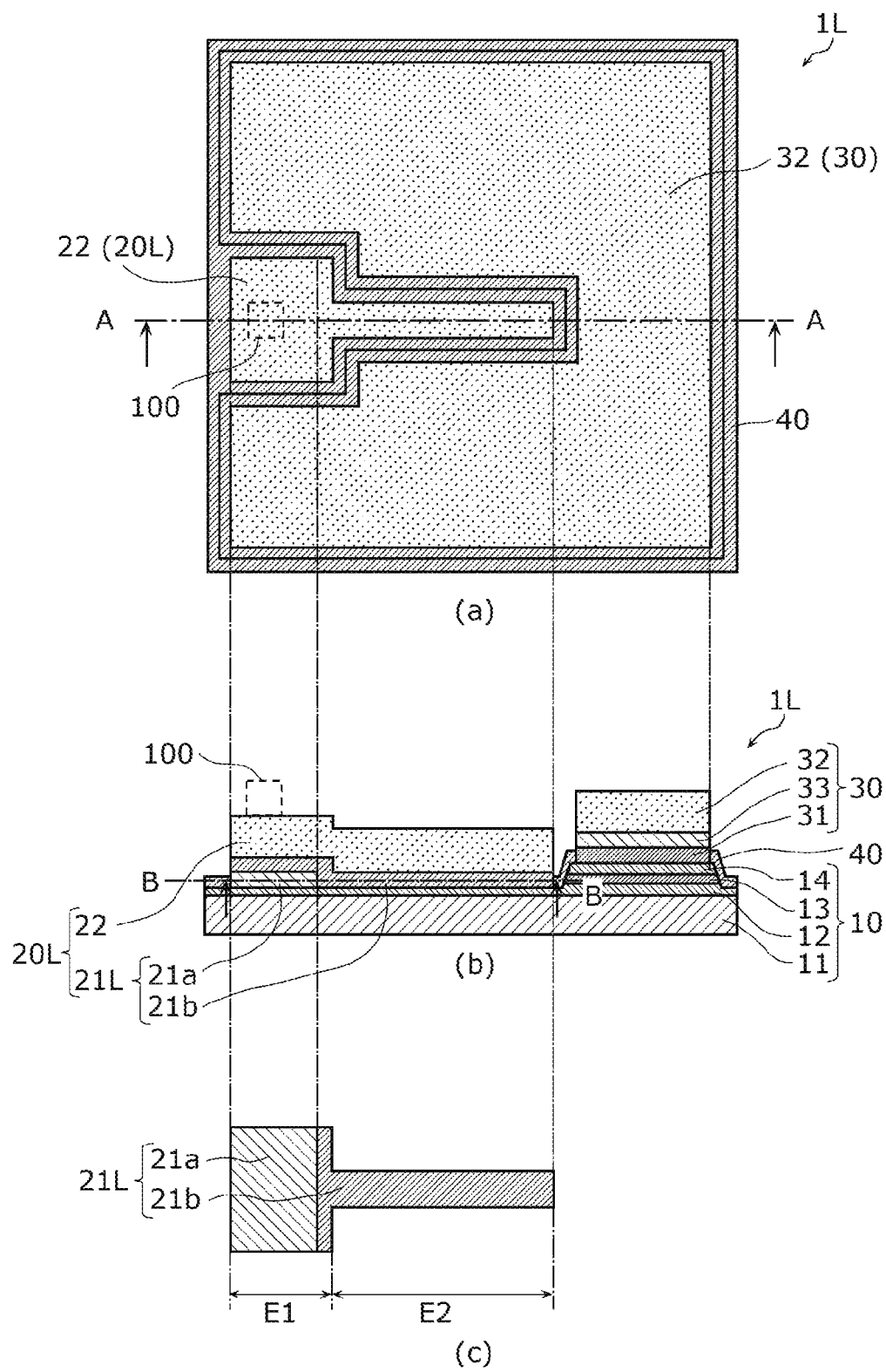
FIG. 26 is a diagram illustrating still another configuration of the semiconductor light-emitting element according to Variation 2 of Embodiment 2.

Although n-side electrode 20K of semiconductor light-emitting element 1K shown by FIG. 25 can be formed by separately forming a Ti layer to be second metal layer 21b of n-side electrode layer 21K and a Ti layer to be an n-side diffusion barrier layer on n-side electrode layer 21K, these layers may be simultaneously formed. For example, first metal layer 21a (e.g., an Al layer) is formed, and then second metal layer 21b (e.g., a Ti layer) to be an n-side diffusion barrier layer is formed to cover first metal layer 21a by EB deposition or sputtering etc. and is made into a predetermined shape by photolithography. As a result, it is possible to form n-side electrode 20L of semiconductor light-emitting element 1L as shown by FIG. 26. To put it another way, each of second metal layer 21b of n-side electrode layer 21L that also serves as the n-side diffusion barrier layer and n-side wiring layer 22 is recessed in extension portion E2

Variation 3 of Embodiment 2

Figure 27:
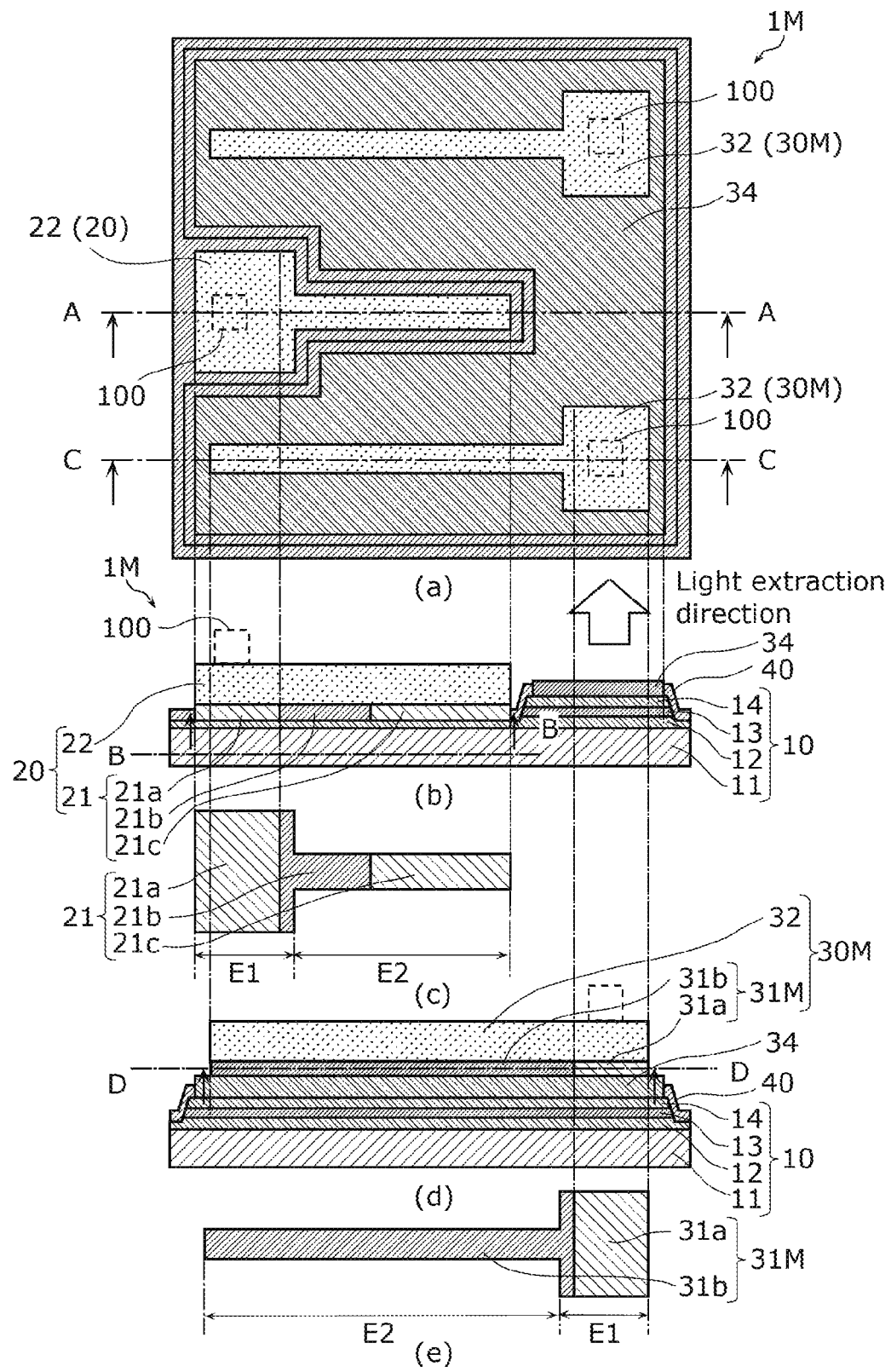
FIG. 27 is a diagram illustrating a configuration of a semiconductor light-emitting element according to Variation 3 of Embodiment 2.

Next, semiconductor light-emitting element 1M according to Variation 3 of Embodiment 2 will be described with reference to FIG. 27. In FIG. 27, (a) is a plan view of semiconductor light-emitting element 1M according to Variation 3 of Embodiment 2, (b) is a vertical cross-sectional view of semiconductor light-emitting element 1M along line A-A shown by (a), and (c) is a horizontal cross-sectional view of semiconductor light-emitting element 1M along line B-B shown by (b).

Semiconductor light-emitting element 1M according to the present variation differs from semiconductor light-emitting element 1G according to Variation 5 of Embodiment 1 shown by FIG. 21 in a configuration of p-side electrode 30M.

Specifically, whereas p-side electrode layer 31G of p-side electrode 30G includes first metal layer 31a, second metal layer 31b, and third metal layer 31c in semiconductor light-emitting element 1G according to Variation 5 of Embodiment 1, as shown by (b) and (c) in FIG. 27, in semiconductor light-emitting element 1M according to the variation, p-side electrode layer 31M of p-side electrode 30M does not include third metal layer 31c and includes only first metal layer 31a and second metal layer 31b. In the present embodiment, second metal layer 31b of p-side electrode layer 31M extends across extension portion E2.

As described above, as with semiconductor light-emitting element 1 according to Embodiment 1, in semiconductor light-emitting element 1M according to the present variation, n-side electrode 20 includes n-side electrode layer 21 and n-side wiring layer 22 disposed on n-side electrode layer 21, and n-side electrode layer 21 includes first metal layer 21a disposed in power feeding portion E1, and second power feeding portion 21b disposed closer to an extension portion E2 side than first metal layer 21a is and having an electrical conductivity lower than an electrical conductivity of first metal layer 21a.

Even when a portion having a varying width is disposed in n-side electrode 20, this configuration can reduce electromigration while suppressing an increase in driving voltage. In addition, it is possible to suppress a decrease in light extraction efficiency.

Moreover, in semiconductor light-emitting element 1M according to the present variation, p-side electrode 30M includes p-side electrode layer 31M and p-side wiring layer 32 disposed on p-side electrode layer 31M, and p-side electrode layer 31M includes first metal layer 31a disposed in power feeding portion E1, and second metal layer 31*b* disposed closer to the extension portion E2 side than first metal layer 31*a* is and having an electrical conductivity lower than an electrical conductivity of first metal layer 31*a*.

Even when a portion having a varying width is disposed in p-side electrode 30M, this configuration can reduce electromigration while suppressing an increase in driving voltage.

It should be noted that although p-side electrode 30M does not include a p-side diffusion barrier layer in semiconductor light-emitting element 1M according to the present variation, as with semiconductor light-emitting element 1 according to Embodiment 1, p-side electrode 30M may include p-side diffusion barrier layer 33. In this case, p-side diffusion barrier layer 33 is disposed between p-side electrode layer 31M and p-side wiring layer 32.

Other Variations

Although the semiconductor light-emitting elements according to the present disclosure have been described above based on Embodiments 1 and 2 and variations thereof, the present disclosure is not limited to Embodiments 1 and 2 and the variations.

For example, forms obtained by adding various modifications to Embodiments 1 and 2 and their variations that may be conceived by a person skilled in the art as well as forms realized by arbitrarily combining the constituent elements and functions in Embodiments 1 and 2 and their variations are included in the present disclosure, as long as these forms do not depart from the essence of the present disclosure.

In one instance, the configuration of n-side electrode 20A of semiconductor light-emitting element 1A according to Variation 1 of Embodiment 1 can be applied to n-side electrode 20H of semiconductor light-emitting element 1H according to Embodiment 2. Moreover, the configuration of n-side electrode 20C of semiconductor light-emitting element 1C according to Variation 3 of Embodiment 1 can be applied to n-side electrode 20H of semiconductor light-emitting element 1H according to Embodiment 2.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor light-emitting elements according to the present disclosure are useful as light sources of various equipment for illumination purpose or display purpose etc.

The invention claimed is:

1. A semiconductor light-emitting element comprising:
a semiconductor layer including a compound semiconductor; and
an electrode disposed on the semiconductor layer, the electrode including a power feeding portion and an extension portion extending from the power feeding portion,
wherein the power feeding portion has a width greater than a width of the extension portion,
the electrode includes an electrode layer disposed on a semiconductor layer side of the electrode, and a wiring layer disposed on the electrode layer,
the electrode layer includes a first metal layer disposed in the power feeding portion, and a second metal layer disposed closer to an extension portion side than the first metal layer is and directly connected to the first metal layer,
the first metal layer and the second metal layer are in ohmic contact with the semiconductor layer,
the first metal layer has an electrical conductivity higher than an electrical conductivity of the second metal layer, and
the wiring layer is continuously disposed on the first metal layer and the second metal layer.

2. The semiconductor light-emitting element according to claim 1,
wherein the second metal layer is disposed in the power feeding portion, and
in a region of the power feeding portion in which the second metal layer is disposed, the second metal layer has a maximum width less than or equal to a maximum width of the power feeding portion and greater than a maximum width of the extension portion.

3. The semiconductor light-emitting element according to claim 1,
wherein the second metal layer is disposed in the extension portion, and
in a region of the extension portion in which the second metal layer is disposed, the second metal layer has a maximum width less than or equal to a maximum width of the extension portion and less than a maximum width of the power feeding portion.

4. The semiconductor light-emitting element according to claim 1,
wherein the second metal layer is disposed in a region including a position which is along a direction from the power feeding portion to the extension portion and at which a differential value of a width of the electrode layer is minimum, or a region including a position which is along the direction from the power feeding portion to the extension portion and at which the differential value is discontinuous.

5. The semiconductor light-emitting element according to claim 1,
wherein in the extension portion, a third metal layer is disposed across the second metal layer from a first metal layer side and directly connected to the second metal layer, and
the first metal layer and the third metal layer comprise a same material.

6. The semiconductor light-emitting element according to claim 5,
wherein in the extension portion, a fourth metal layer is disposed across the third metal layer from a second metal layer side and directly connected to the third metal layer, and
the second metal layer and the fourth metal layer comprise a same material.

7. The semiconductor light-emitting element according to claim 6,
wherein the second metal layer and the fourth metal layer that are separated from each other.

8. The semiconductor light-emitting element according to claim 6,
wherein the electrode includes a branch portion on an opposite side of the power feeding portion, in the extension portion, and
the fourth metal layer is disposed in the branch portion.

9. The semiconductor light-emitting element according to claim 1,
wherein the electrode includes a branch portion on an opposite side of the power feeding portion, in the extension portion, and
the second metal layer is disposed in the branch portion.

10. The semiconductor light-emitting element according to claim 1,
wherein the extension portion includes a portion on an opposite side of the power feeding portion, the portion having a width less than a width of a portion on a power feeding portion side.

11. The semiconductor light-emitting element according to claim 10,
wherein the width of the portion varies so that the width of the portion narrows in steps toward a tip of an extension direction of the extension portion.

12. The semiconductor light-emitting element according to claim 10,
wherein the width of the portion gradually narrows toward a tip of an extension direction of the extension portion.

13. The semiconductor light-emitting element according to claim 1,
wherein a diffusion barrier layer is disposed between the electrode layer and the wiring layer.

14. The semiconductor light-emitting element according to claim 13,
wherein the diffusion barrier layer and the second metal layer comprise a same material.

15. The semiconductor light-emitting element according to claim 1,
wherein in the extension portion, the wiring layer has a wiring resistance value lower than a wiring resistance value of the electrode layer.

16. The semiconductor light-emitting element according to claim 1,
wherein the compound semiconductor is a group III-V compound semiconductor.

17. The semiconductor light-emitting element according to claim 1,
wherein the compound semiconductor is a nitride semiconductor.

* * * * *